United States Patent
Jeong et al.

(10) Patent No.: US 7,038,926 B2
(45) Date of Patent: May 2, 2006

(54) MULTI-PORT STATIC RANDOM ACCESS MEMORY

(75) Inventors: Seong-Ik Jeong, Seoul (KR); Kyung-Yul Kim, Gunpo-si (KR)

(73) Assignee: Syncoam Co., Ltd., Scongnam-si (KR)

( * ) Notice: Subject to any disclaimer, the term of this patent is extended or adjusted under 35 U.S.C. 154(b) by 34 days.

(21) Appl. No.: 10/495,624

(22) PCT Filed: Jun. 25, 2002

(86) PCT No.: PCT/KR02/01201

§ 371 (c)(1),
(2), (4) Date: May 14, 2004

(87) PCT Pub. No.: WO03/043021

PCT Pub. Date: May 22, 2003

(65) Prior Publication Data

US 2005/0083765 A1    Apr. 21, 2005

(30) Foreign Application Priority Data

Nov. 16, 2001  (KR)  ...................... 10-2001-0071390

(51) Int. Cl.
*G11C 5/06* (2006.01)
(52) U.S. Cl. .................. 365/63; 365/72; 257/401; 257/758; 257/503

(58) Field of Classification Search .................. 365/63, 365/72; 257/401, 758, 503
See application file for complete search history.

(56) References Cited

U.S. PATENT DOCUMENTS

| | | | |
|---|---|---|---|
| 5,742,086 A * | 4/1998 | Rostoker et al. | ............. 257/300 |
| 5,889,329 A * | 3/1999 | Rostoker et al. | ............. 257/758 |
| 6,407,434 B1* | 6/2002 | Rostoker et al. | ............. 257/401 |
| 6,914,806 B1* | 7/2005 | Kunikiyo | ..................... 365/158 |

FOREIGN PATENT DOCUMENTS

KR    WO003043021 A1 *  5/2003

* cited by examiner

*Primary Examiner*—Viet Q. Nguyen
(74) *Attorney, Agent, or Firm*—Stanzione & Kim, LLP

(57) ABSTRACT

A multi-port static random access memory for reducing an occupation area of a layout memory cells on a substrate having the improvements from a first plurality of metal electrode layers on a first plurality of active regions included in one unit cell and in other unit cell neighbored to the corresponding one unit cell of the first plurality of metal electrode layers being commonly connected to the power supply source, comprises: a second plurality of the metal electrode layers on second plurality of the active regions and to be independently and separately connected to the power supply source, by every one unit cell in cell array.

39 Claims, 32 Drawing Sheets

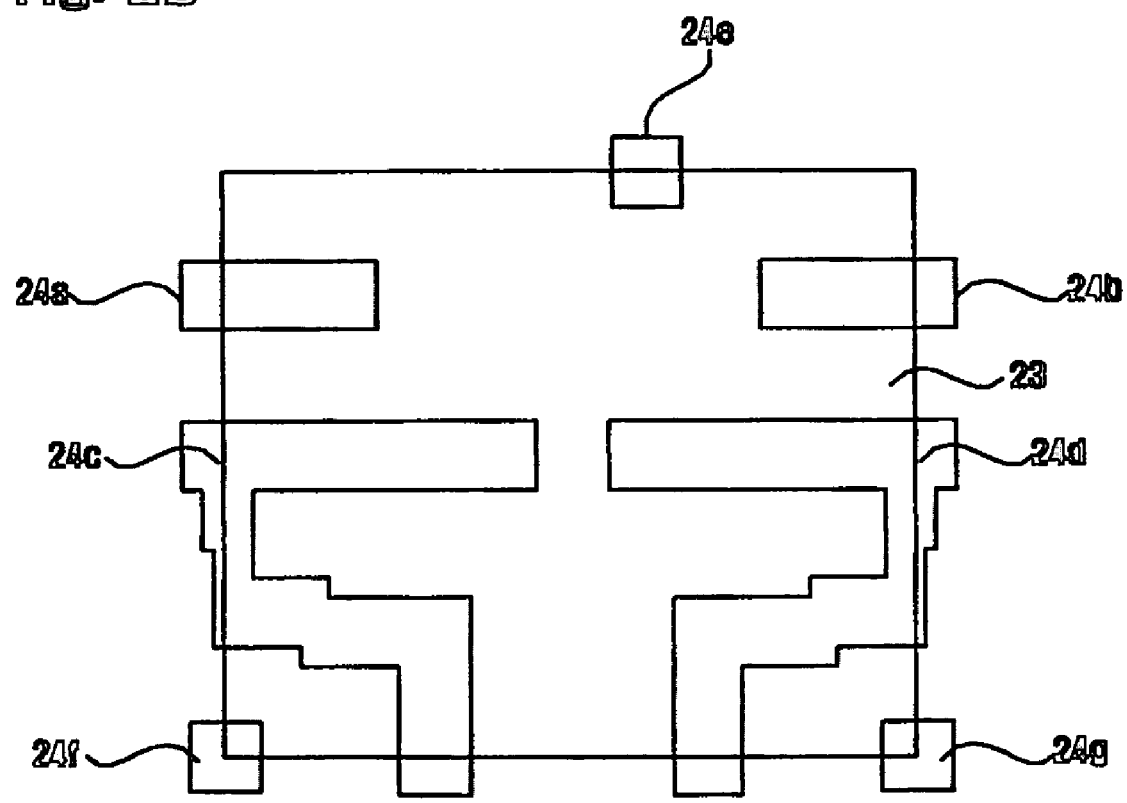

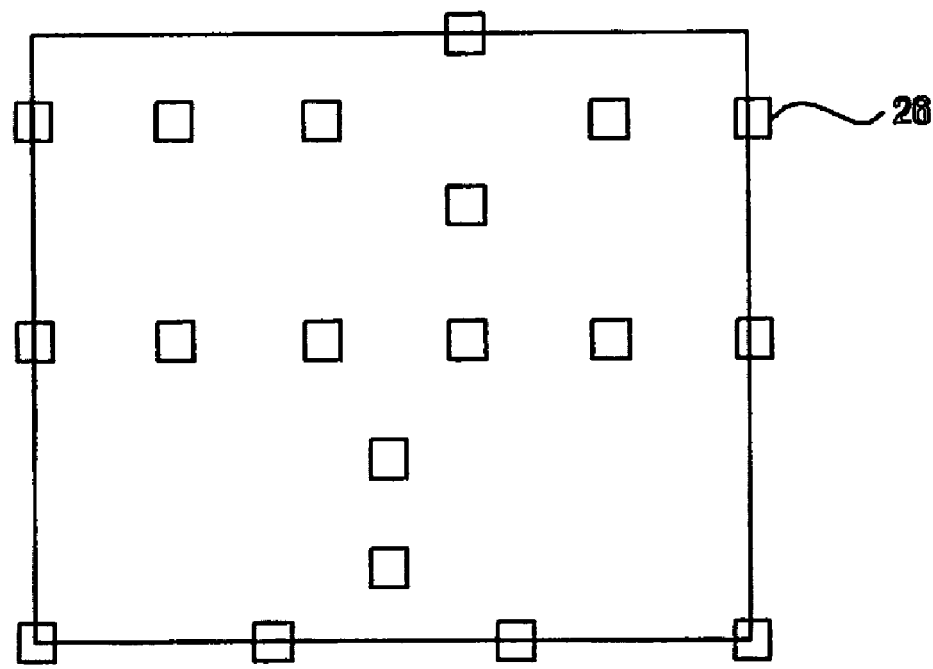

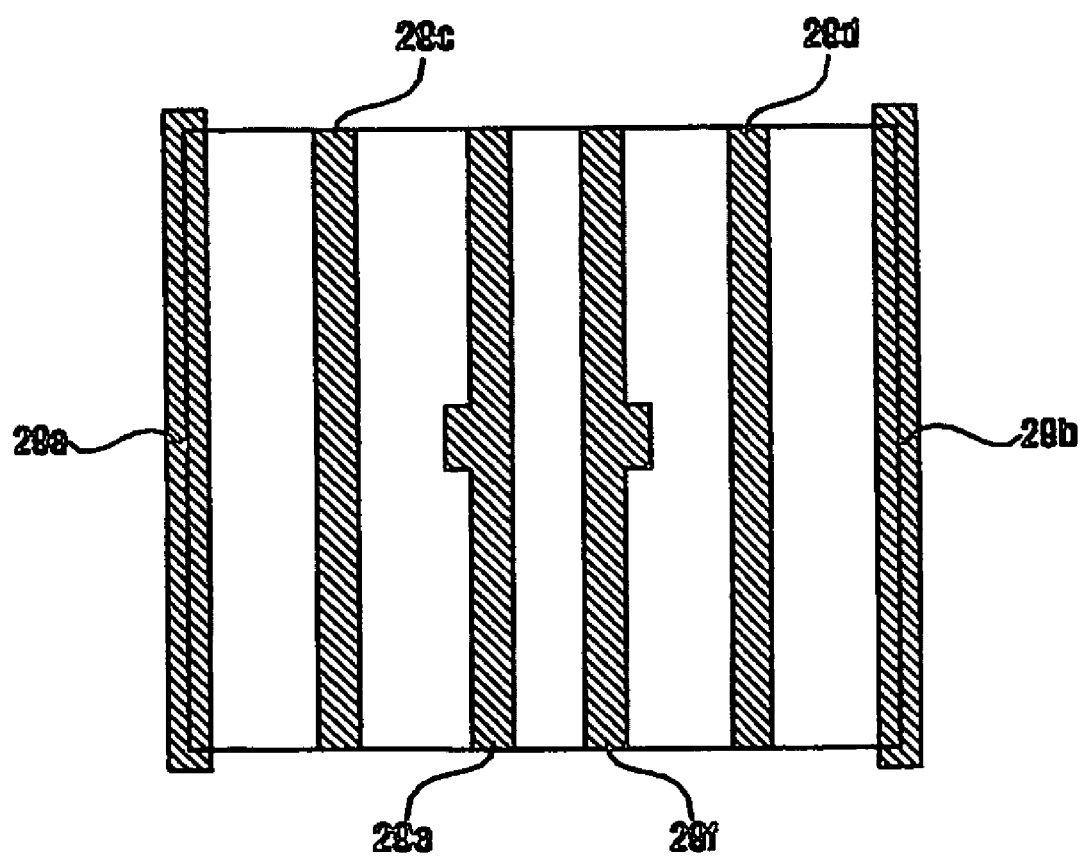

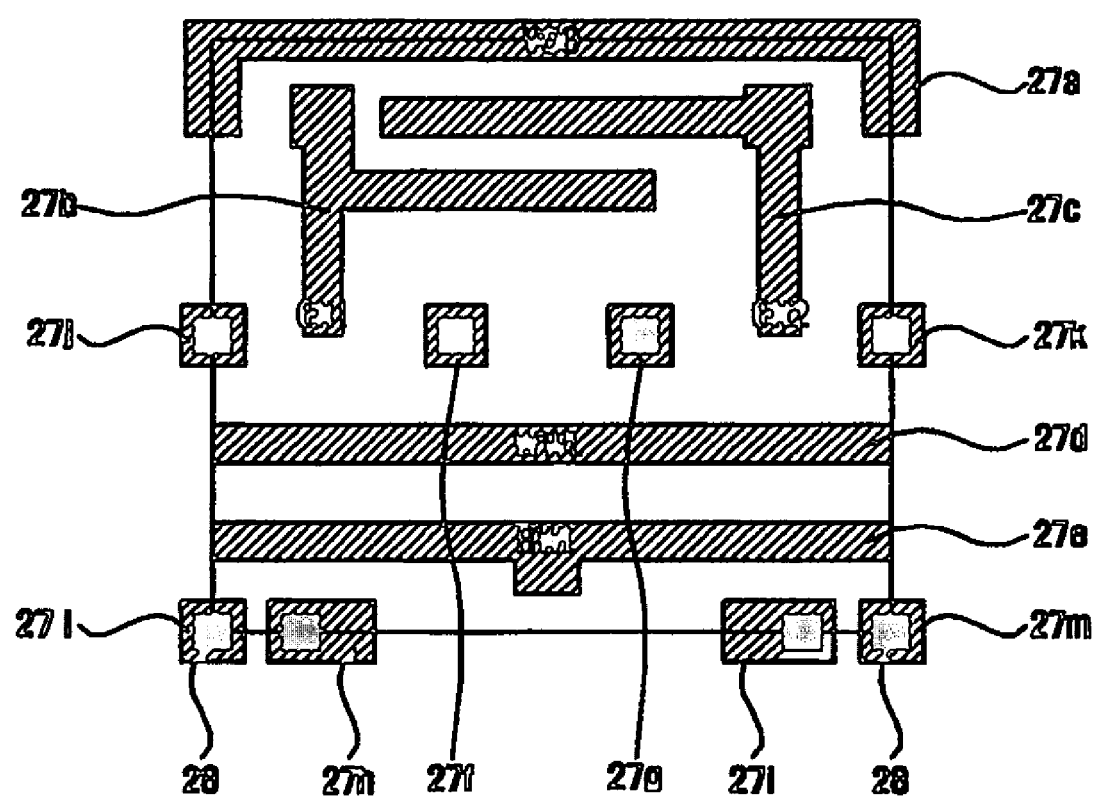

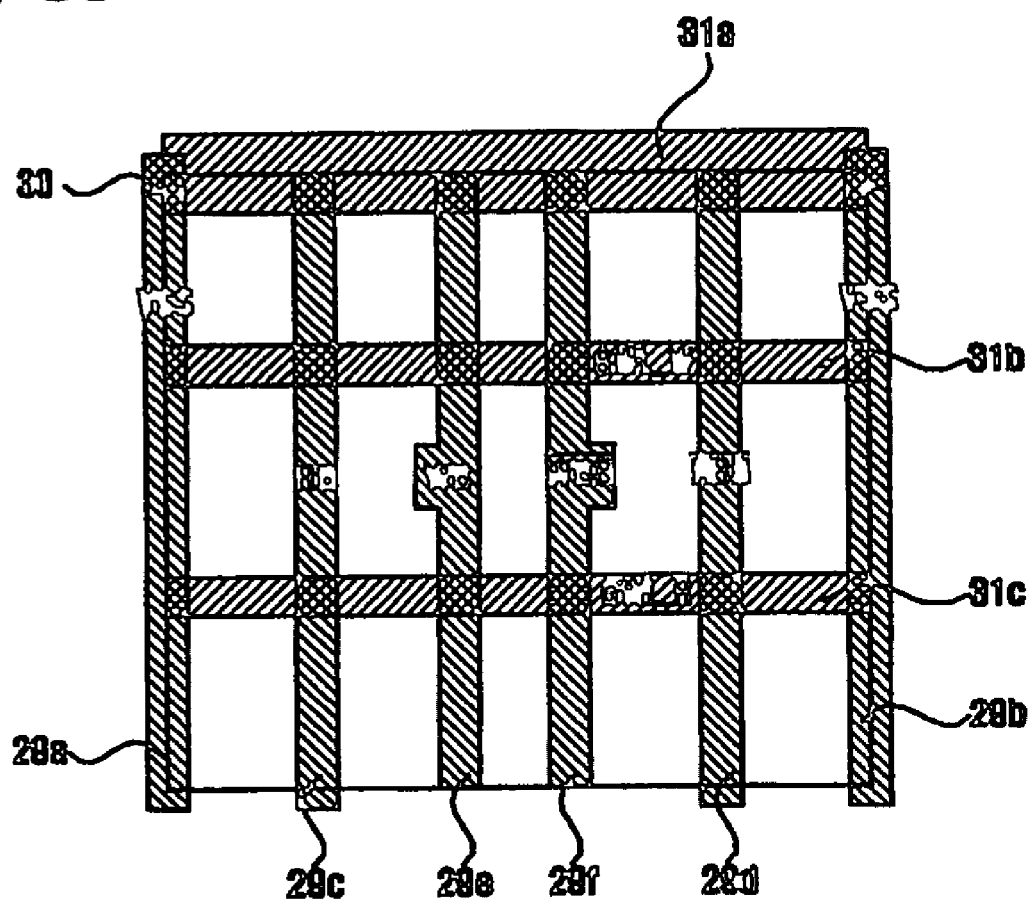

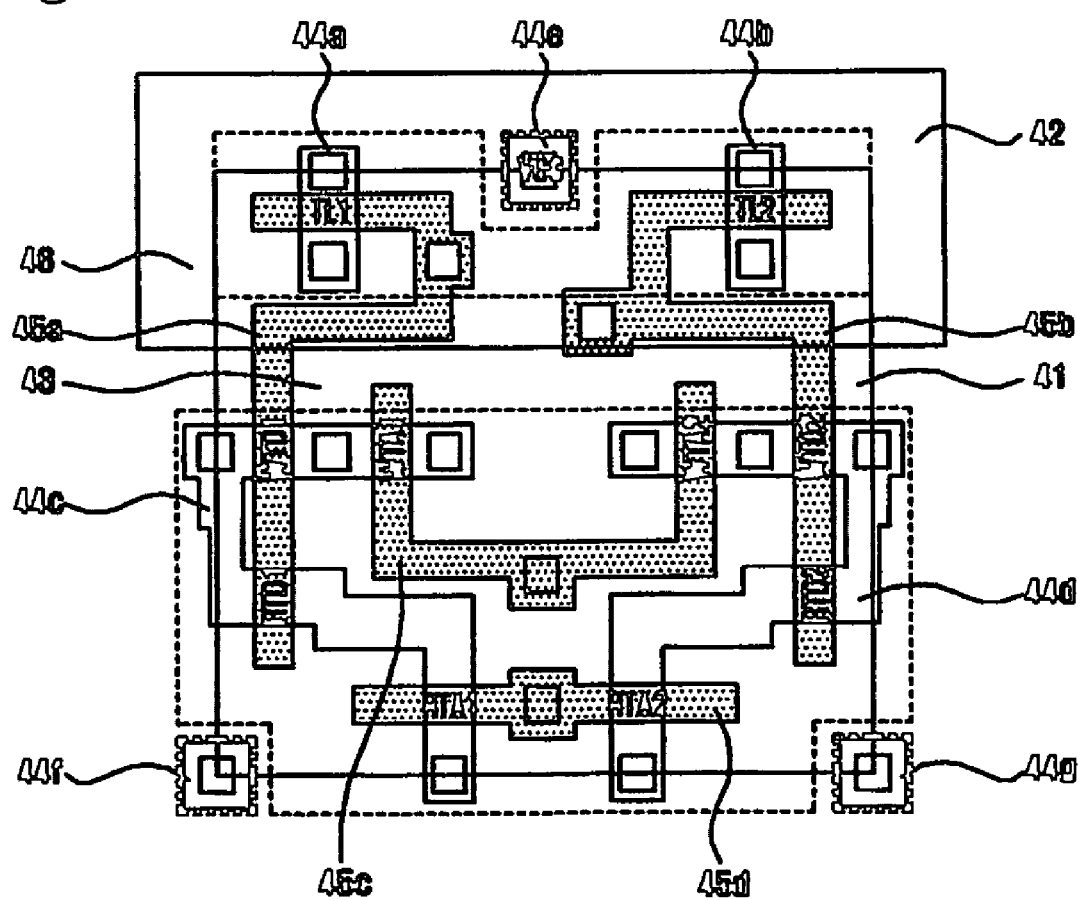

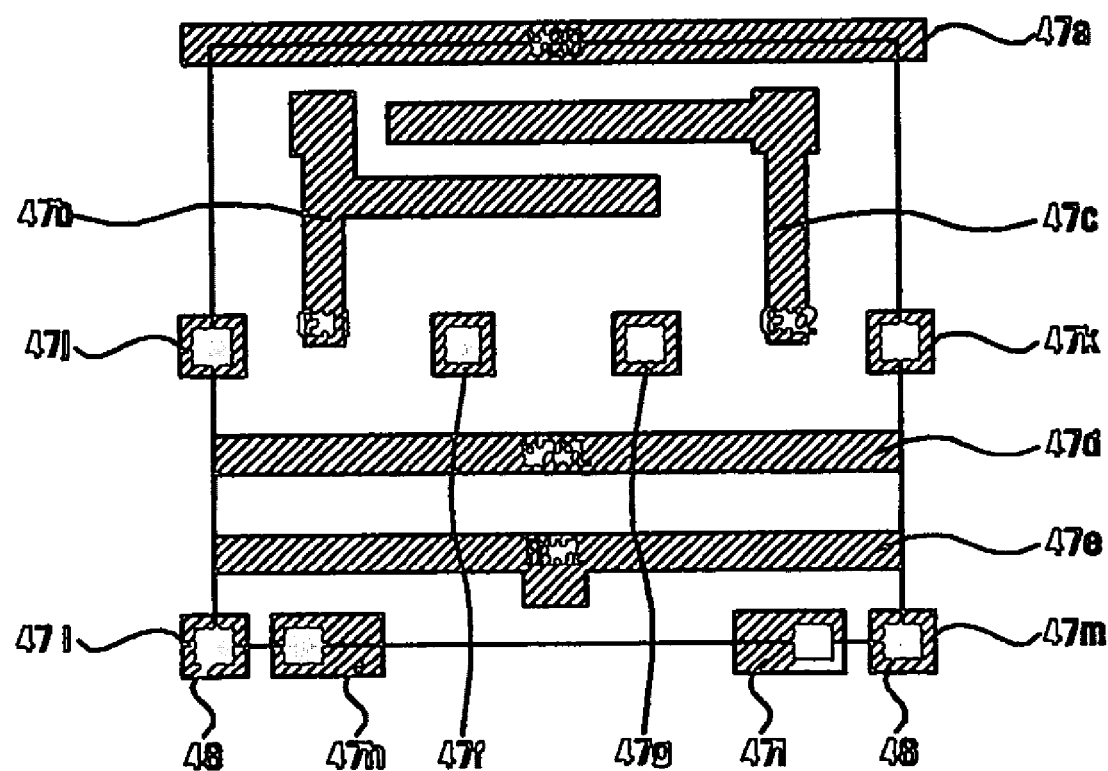

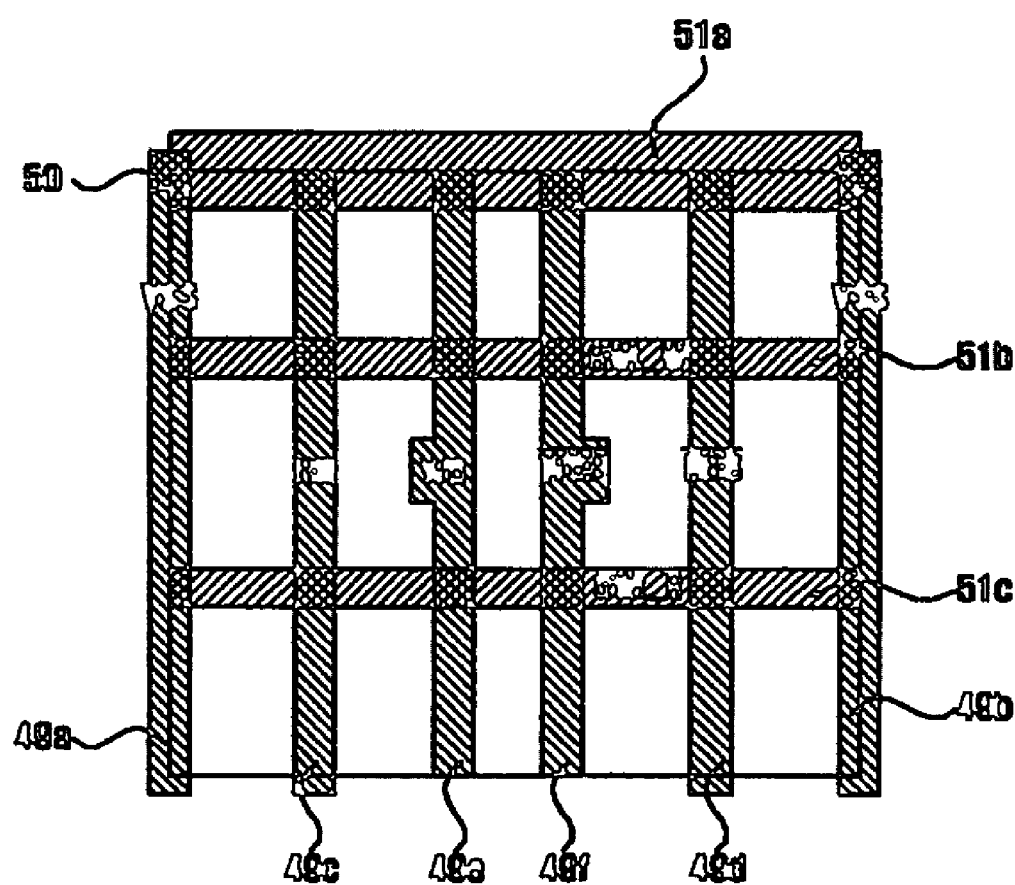

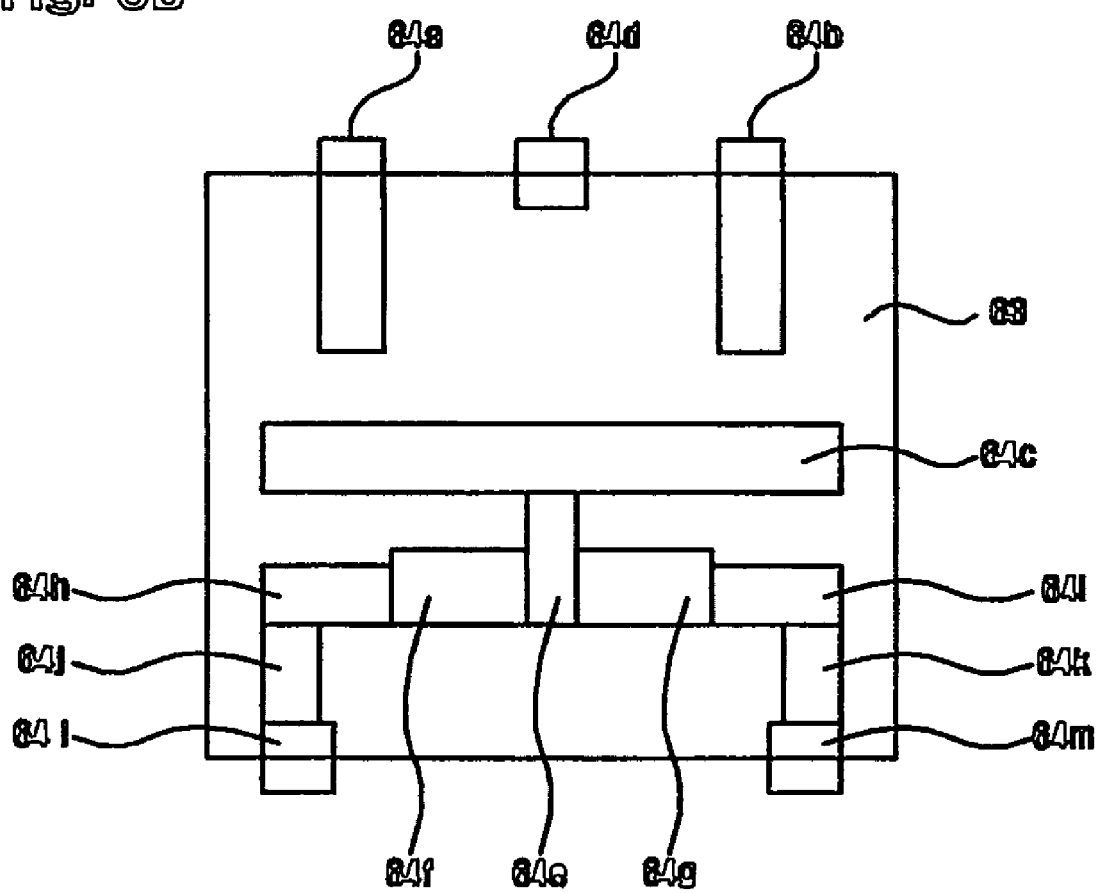

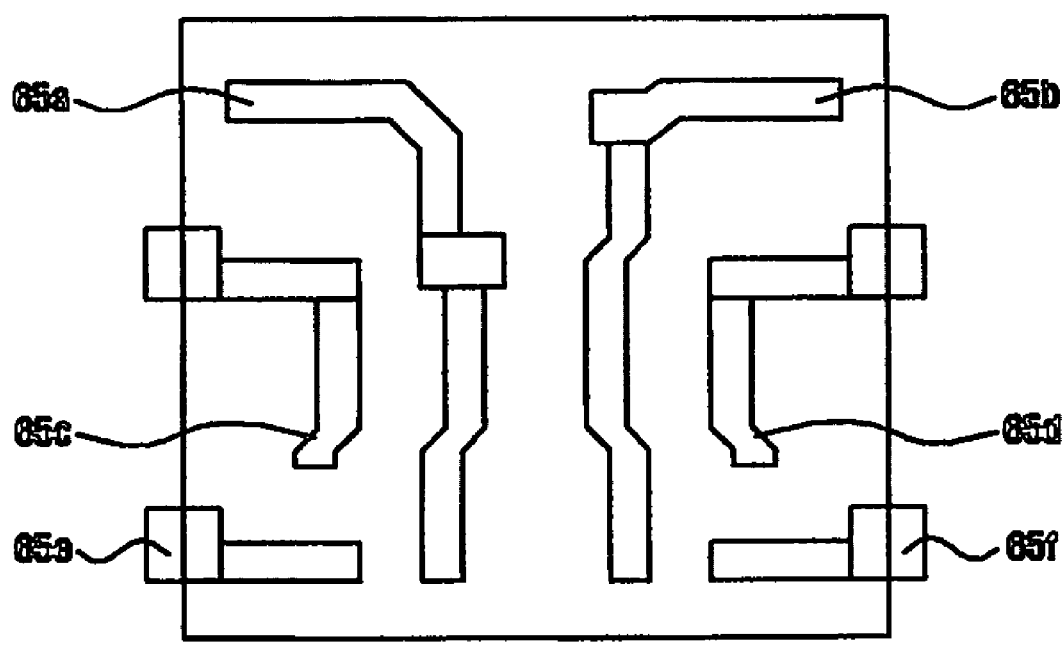

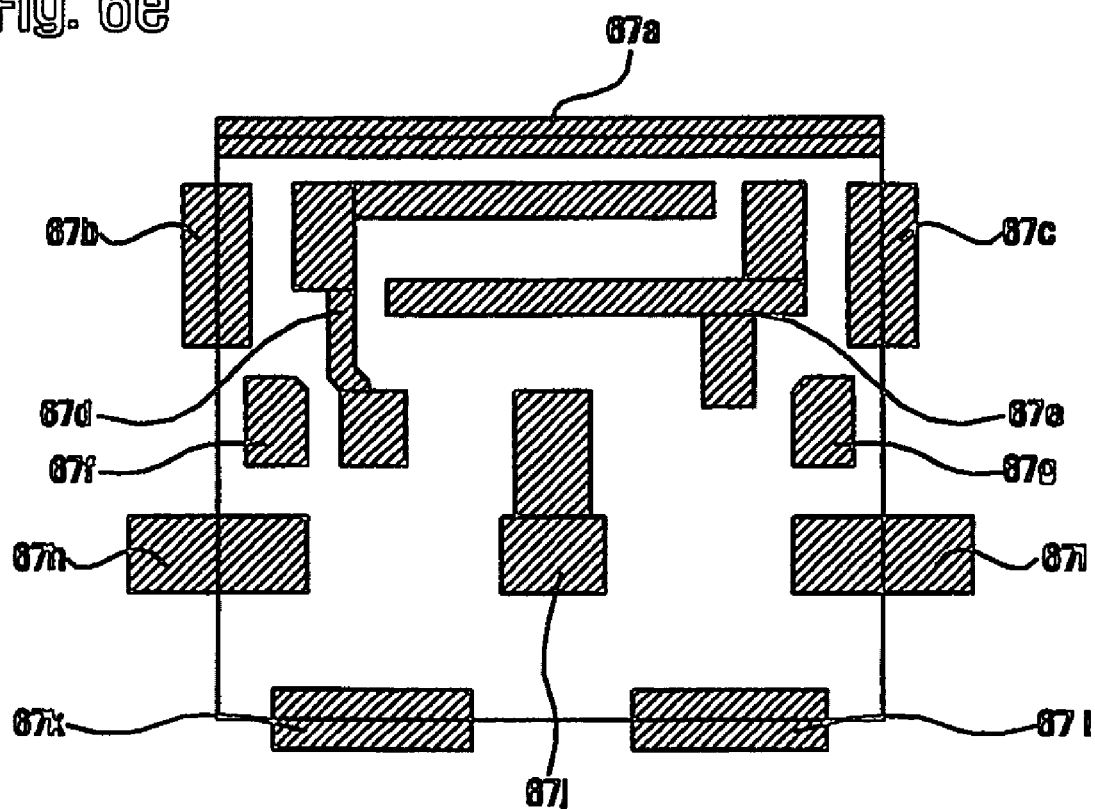

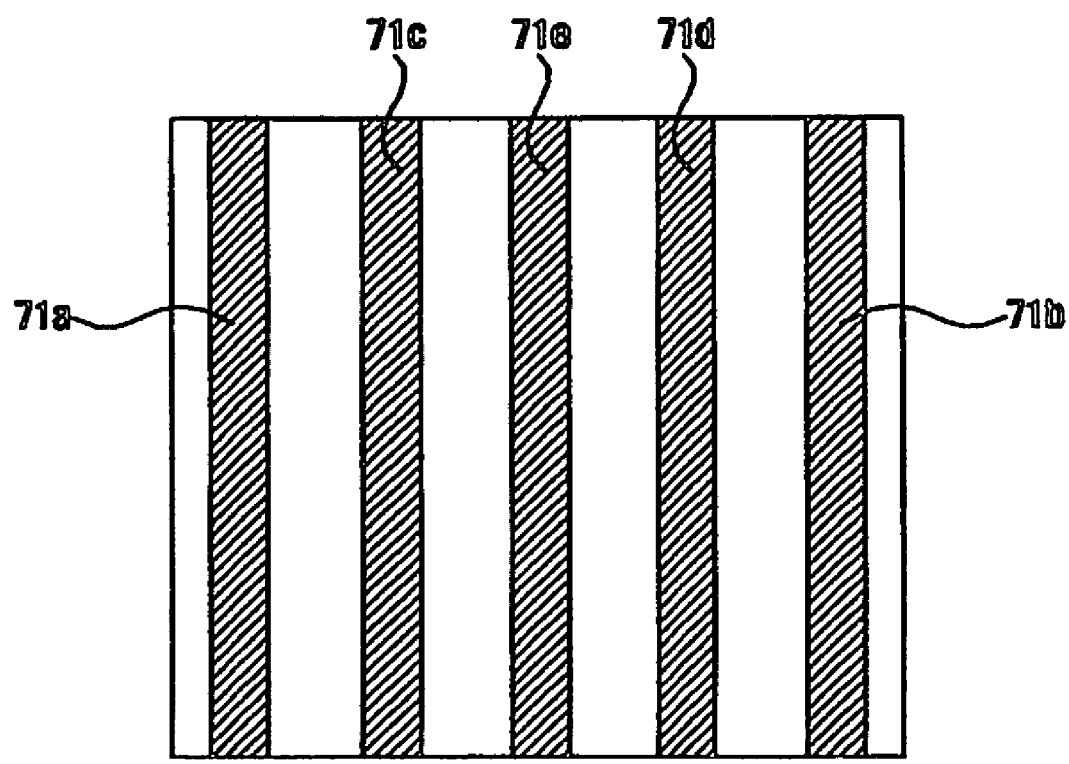

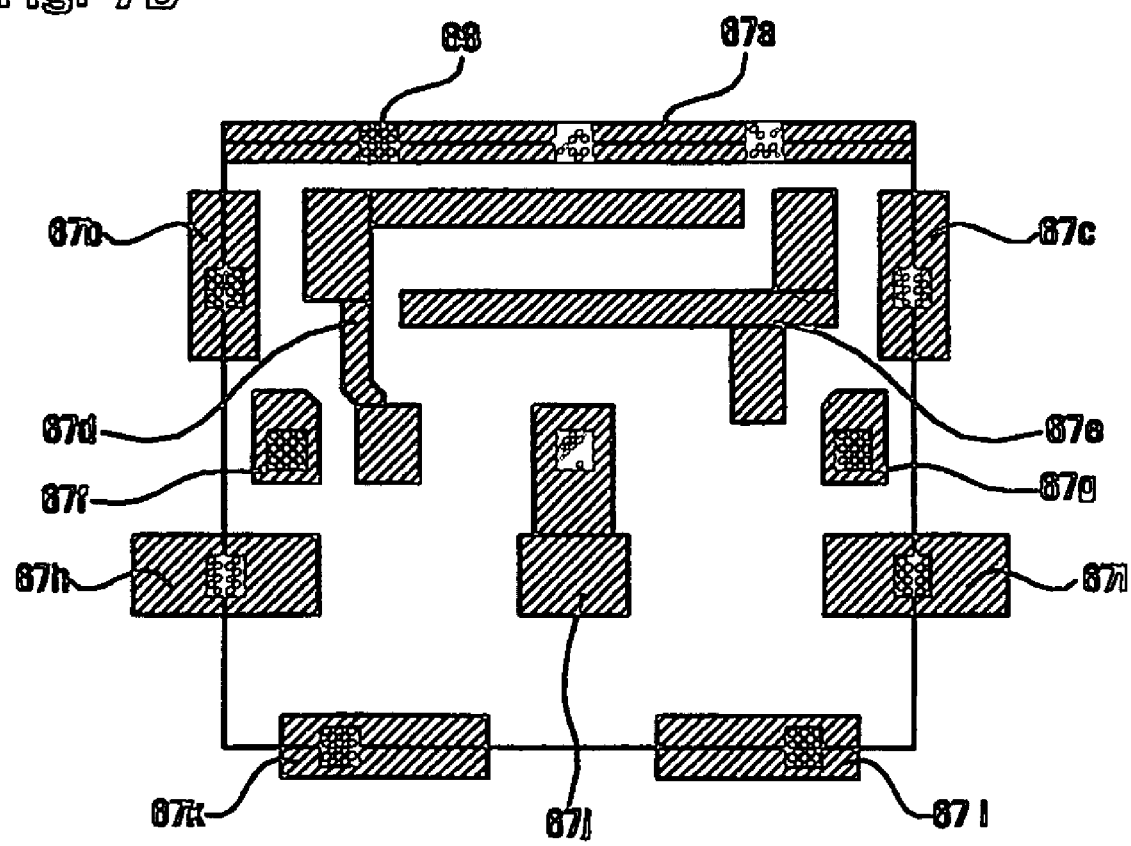

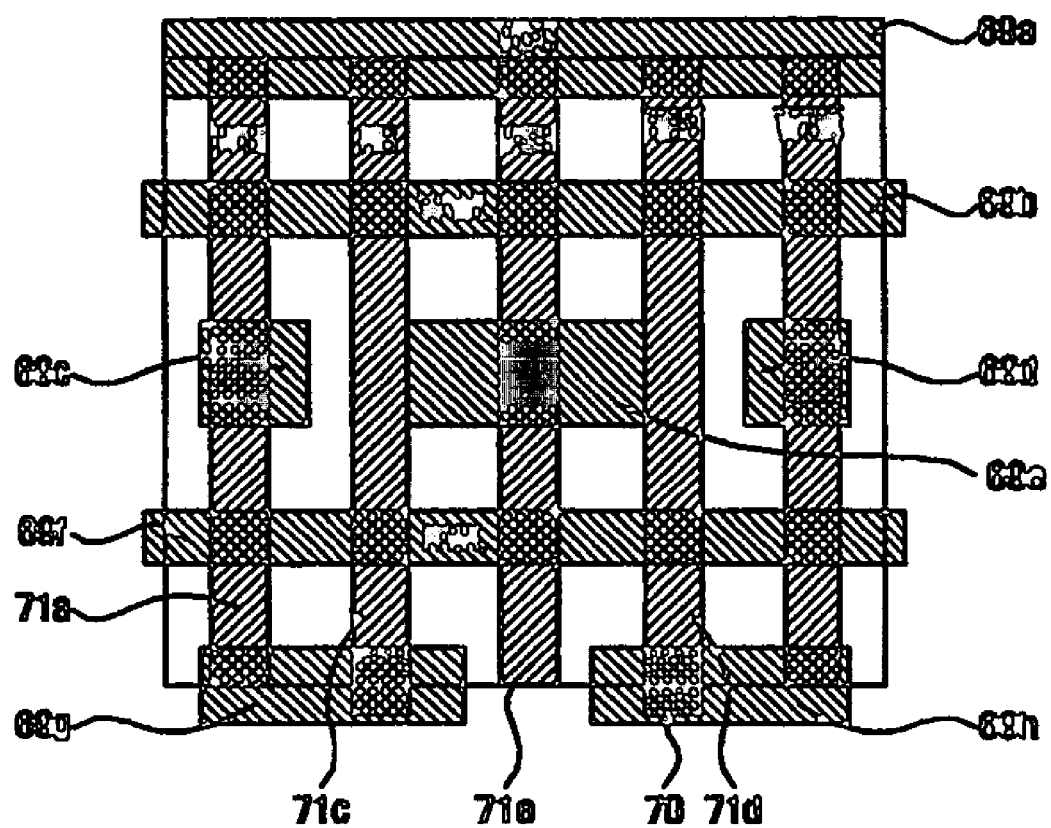

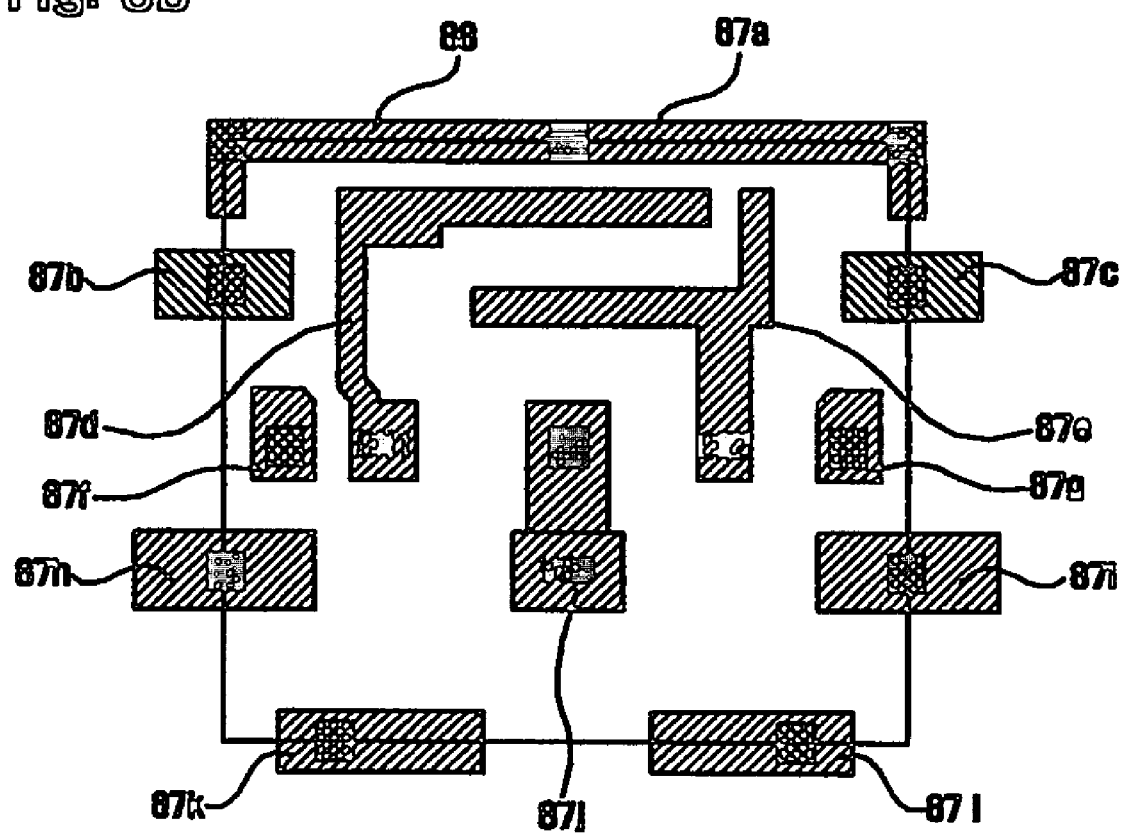

MULTI-PORT STATIC RANDOM ACCESS MEMORY

BACKGROUND OF THE INVENTION

1. Field of the Invention

The present invention relates to a semiconductor device, and in particular to a multi-port static random access memory (hereinafter, referred to as "SRAM") having a high operation speed. Further, the present invention relates to SRAM in which an occupation area of memory cells laid out on a substrate can be reduced by the formation of an electrical connection layer only within first unit cell in arrangement of memory cell array, for providing a common power supply source to the arrangement of memory cell array.

2. Description of the Related Art

In a conventional SRAM, every first unit cell has a flip-flop circuit including a pair of access transistors, a pair of drive transistors, and a pair of load transistors. Compared to first unit cell having a resistor as a load device in the conventional SRAM first unit cell having a bulk-type PMOS transistor as a load transistor has a lower stand-by current and is good in view of memory cell stability. Moreover, it has widely been used as an embedded memory cell in a conventional SRAM since first unit cell having a resistor as a load device and first unit cell having a bulk-type PMOS transistor as a load transistor had the same steps of a production process. Therefore, a multi-port SRAM has been developed for the purpose of increasing the operation speed of its data input/output and of having a wide system application from such a conventional SRAM. In such a multi-port SRAM, increasing the number of transistors in first unit cell is bad in view of an integration density. Problems such as an integration density, a process margin, and a reliability of an operation speed, however, now do not matter owing to the development of a production process art. A wide system application can be enough to load on people's attentions.

FIG. 1 is a circuit configuration diagram of first embodiment according to a conventional two-port SRAM.

In FIG. 1, a load transistor for common use, a drive transistor for carrying out a write operation, and an access transistor for carrying-out a read operation are shown in first unit cell. There are a pair of read bit line RB and /RBB and a pair of write bit line WB and /WBB in a vertical direction. There are a power supply voltage VCC and a write word line WWL in the upper part of first unit cell, and a power supply ground VSS and a read word line RWL in the lower part of first unit cell.

As be shown in FIG. 1, a pair of write access transistors WTA1 and WTA2, and a pair of read access transistors RTA1 and RTA2, a pair of load transistors TL1 and TL2, a pair of write drive transistors WTD1 and WTD2, and a pair of read drive transistors RTD1, and RTD2 consist of first unit cell. All the above described transistors have a set of first and second electrodes and gate electrode. Gate electrodes of the write access transistors WTA1 and WTA2 in first unit cell are respectively and electrically connected to a write word line WWL. Each of first electrodes of the write access transistors WTA1 and WTA2 is electrically coupled to the corresponding bit line of the pair of write bit line WB and /WBB. Also, gate electrodes of the read access transistors RTA1 and RTA2 are respectively and electrically connected to the read word line RWL. Each of first electrodes of the read access transistors RTA1 and RTA2 is electrically coupled to the corresponding read bit line of the pair of read bit lines RB and /RBB. Each of first electrodes of the load transistors TL1 and TL2 is respectively connected to power supply voltage VCC. Each of gate electrodes of the load transistors TL1 and TL2 is respectively connected to a first pair of common nodes CN1 and CN2. First common node CN1 is electrically linked to second common node CN2 in the first pair of common nodes CN1 and CN2. First write drive transistor WTD1 at the pair of write drive transistors WTD1 and WTD2 and first read drive transistor RTD1 at the pair of read drive transistors RTD1 and RTD2 are in series connected to first load transistor TL1 at the pair of load transistors TL1 and TL2. Each of gate electrodes of first write drive transistor WTD1 and first read drive transistor RTD1 is respectively connected to second common node CN2 of the first pair of the common nodes CN1 and CN2. A serial connection of second write drive transistor WTD2 and second read drive transistor RTD2 is linked to second load transistor TL2. And each of gate electrodes of second write drive transistor WTD2 and second read drive transistor RTD2 is commonly connected to the first pair of common nodes CN1 and CN2. Second electrodes of first load transistor TL1 and first write access transistor WTA1 and first electrode of first write drive transistor WTD1 are electrically linked to each second through first common node CN1.

Further, second electrodes of second load transistor TL2 and second write access transistor WTA2 and first electrode of second write drive transistor WTD2 are mutually connected to second common node CNB, too. Second electrode of first write drive transistor WTD1 and first electrode of first read drive transistor RTD1 are respectively connected to the power supply ground VSS. Each of second electrodes of the pair of read access transistors RTA1 and RTA2 which are PMOS transistors, is respectively connected to the corresponding electrode of the pair of read drive transistors RTD1 and RTD2. And write access transistors WTA1 and WTA2, read access transistors RTA1 and RTA2, write drive transistors WTD1 and WTD2, read drive transistors RTD1 and RTD2 are NMOS transistors. First electrode of first load transistor TL1 is electrically connected to power supply voltage VCC, together with second load transistor TL2 included in the second unit cell neighbored to the corresponding first unit cell. Also, an electrical common connection of first electrode of second load transistor TL2 and first load transistor included in second unit cell neighbored to the corresponding first unit cell is made via power supply voltage VCC. First write drive transistor WTD1 and first read drive transistor RTD1 transistor included in first unit cell are electrically linked to power supply ground VSS, together with second write drive transistor and second read drive transistor neighbored to the corresponding first unit cell. Second write drive transistor WTD2 and second read drive transistor RTD2 are electrically coupled to power supply ground VSS, together with write drive transistor and read drive transistor included in second unit cell neighbored to the corresponding first unit cell.

FIG. 2a to FIG. 2i are patterned layout configuration diagrams for explaining process steps of first embodiment of a two-port SRAM according to a prior art invention.

In FIG. 2a, an N-type well region 22 is formed on first part of a cell formation region 21 in order to define a PMOS transistor which is used as a load transistor, wherein the cell formation region 21 is not a fixed region, rather than can be varied. Second region except the N-type well region 22 in the cell formation region 21 is a P type well region. By a formation of a device isolation layer (not shown) in a field region 23 of the cell formation region 21 are made first to seventh active regions 24a to 24g as shown in FIG. 2b. In FIG. 2c, first to fourth electrode patterned layers 25a to 25d are passed through over at least any first portion of the first to seventh active regions 24a to 24g. By exposing the first to seventh active regions 24a to 24g using the first to fourth electrode patterned layers 25a to 25d impurity regions (not shown) are formed within the substrate surfaces of their regions 24a to 24g. A selective exposure of the impurity regions or the first to seventh active regions 24a to 24g makes a formation of a plurality of contact regions 26 which are selectively etched after repeatedly carrying out a formation of an insulation layer between first layer and a corresponding second layer over contact regions 26 in FIG. 2d.

As shown in FIG. 3a, an N-type well region 22 is formed in order to function as a pair of first and second load transistors TL1 and TL2. A formation of first and second active regions 24a and 24b is made by a separation of the N-type well region 22 to horizontal direction. In some region except N type well region 22 in the cell formation region 21 which is a P-type well region, third and fourth active regions 24c and 24d which face each second are formed by meeting at least first extension portion to a perpendicular direction from an intersection between a long axis of a horizontal direction and a long axis of a vertical direction. Also, fifth active region 24e is formed on a separation region of first and second active regions 24a and 24b. Sixth and seventh active regions 24f and 24g are respectively formed on left and right lower portions of third and fourth active regions 24c and 24d. A first metal electrode layer 25a is formed in order to be utilized as gate electrodes of first load transistor TL1, first write drive transistor WTD1, and first read drive transistor RTD1. First metal electrode layer 25a has a configuration in which a central portion of first active region 24a is passed on in a vertical direction and at least two portions of third active regions 24c are passed on. Second metal electrode layer 25a is formed so that a central portion of second active regions 24d are passed on. As gate electrodes of second load transistor TL2, second write drive transistor WTD2, and second read drive transistor RTD2 functions first metal electrode layer 25a. Third metal electrode layer 25c is formed in order to be utilized as gate electrodes of first and second write access transistors WTA1 and WTA2. Third metal electrode layer 25c has a configuration in which third and fourth active regions 24c and 24d are respectively passed on to vertical direction and their vertical extension portions are met at a predetermined position with each second so that a horizontal extension portion is formed in a horizontal direction. Fourth metal electrode layer 25d which is utilized as gate electrodes of first and second read access transistor RTA1 and RTA2, is formed so that the lower portions of third and fourth active regions 24c and 24d are passed on at the same time. Further, a plurality of contact regions 26 are formed on first to seventh active regions 24a to 24g of which any portion are not passed on by first to fourth first to fourth metal electrode layer 25a to 25d or on first to fourth metal electrode layer 25a to 25d. Fifth active region 24e is formed in order to be defined as well bias of N type well region 22. After carrying out a process step for the purpose of obtaining the above described patterned configuration, a process step for forming a first group of metal electrical wires including metal electrical wire layers 27a to 27m is performed as shown in FIG. 2e.

In FIG. 2e, first to fifth metal electrical wire layers 27a to 27e are formed in order to be utilized as a power supply voltage VCC, a write word line WWL, a read word line RWL, etc., and sixth to thirteenth metal electrical wire layers 27f to 27e are formed in order to be utilized as an interior electrical wire. A plurality of via holes 28 are formed, as shown in FIG. 2f, on first to thirteenth metal electrical wire layers 27a to 27e. In FIG. 3b, first metal electrical wire layer 27a is electrically contacted with first electrodes of first and second load transistors TL1 and TL2. A electrical connection of gate electrodes of first load transistor TL1, first write drive transistor WTD1, and read drive transistor RTD1, and first common node CN1 is made by second metal electrical wire layer 27b. Third metal electrical wire layer 27c causes second common node CN2 to make an electrical connection of gate electrodes of second load transistor TL2, second write drive transistor WTD2, and second read drive transistor RTD2. Fourth metal electrical wire layer 27d which is a horizontal extension, is formed in order to electrically contact with gate electrodes of first and second write access transistor WTA1 and WTA2. In order to electrically contact with gate electrodes of first and second read access transistors RTA1 and RTA2, fifth metal electrical wire layer 27e is formed. Sixth and seventh metal electrical wire layer 27f and 27g are formed in order to electrically contact with first electrodes of first and second write access transistors WTA1 and WTA2. Eighth and ninth metal electrical wire layers 27h and 27i are formed in order to be electrically contacted with first electrodes of first and second read access transistors RTA1 and RTA2. With third common node CN3 of first write drive transistor WTD1 and first read drive transistor RTD1 is electrically contacted tenth metal electrical wire layer 27j. Eleventh metal electrical wire layer 27k is formed in order to electrically contact with fourth common node CN4 of second write drive transistor WTD2 and second read drive transistor RTD2. Twelfth and thirteenth metal electrical wire layers 27l and 27m are formed in order to contact with power supply voltage VCC. First plurality of via holes are respectively formed on sixth to thirteenth metal electrical wire layer 27f to 27m. After carrying out process step for the purpose of obtaining the patterned configuration as shown in FIG. 2e, process step for forming a second group of metal electrical wires including metal electrical wire layers 29a to 29f is performed as shown in FIG. 2g.

In FIG. 2g, first metal electrical wire layer 29a and second metal electrical wire layer 29b are formed so that these metal electrical wire layers 29a and 29b may pass on edge parts of both left and right portions of a cell formation region 21 to a vertical direction. First metal electrical wire layer 29a and second metal electrical wire layer 29b function as power supply ground VSS. Third and fourth metal electrical wire layers 29c and 29d are formed in order to function as a pair of read bit line RB and /RBB. Also, third and fourth metal electrical wire layers 29e and 29f are separated from each second at a predetermined distance between first and second metal electrical wire layers 29a and 29b so that these metal electrical wire layers 29c and 29d may face. Fifth and sixth metal electrical wire layers 29e and 29f are formed, for the purpose of functioning as a pair of write bit lines WB and /WBB, so that third and fourth metal electrical wire layers 29c and 29d are separated from each second at a predetermined distance between third and fourth metal electrical wire layers 29c and 29d with a shape of an inverse face of these metal electrical wire layers 29e and 29f On any end of first and second metal electrical wire layers are second plurality of via holes 30, for the purpose of contacting with power supply ground VSS as known in FIG. 2f. Further, a third group of metal electrical wires including metal electrical wire layers 31a to 31c are formed in a horizontal direction as known in FIG. 2g.

In FIG. 3c, tenth electrical wire layer 27j and twelfth electrical wire layer 27l of the first metal electrical wire group are electrically coupled through first via holes to first electrical wire layer 29a of the second metal electrical wire group. Eleventh electrical wire layer 27k and thirteenth electrical wire layer 27m of the first metal electrical wire group are electrically contacted through first via holes with second electrical wire layer 29b of the second metal electrical wire group. Eighth electrical wire layer 27h of the first metal electrical wire group are electrically contacted through first via holes with third electrical wire layer 29c of the second metal electrical wire group. Ninth electrical wire layer 27i of the first metal electrical wire group are electrically contacted through first via holes with fourth electrical wire layer 29d of the second metal electrical wire group. Sixth electrical wire layer 27f of the first metal electrical wire group are electrically contacted through first via holes with fifth electrical wire layer 29e of the second metal electrical wire group. Seventh metal electrical wire layer 27g of the first metal electrical wire group are electrically contacted through first via holes with sixth electrical wire layer 29f of the second metal electrical wire group. All first to sixth metal electrical wire layers 29a to 29f have a vertical extension.

First and second electrical wire layers 29a and 29b of the second metal electrical wire group are electrically contacted through first via holes with first electrical wire layer 31a of the third metal electrical wire group. First metal electrical wire layer 31a has a horizontal extension. As a write global word line GWL_W second metal electrical wire layer 31b of the third metal electrical wire group is utilized. Third metal electrical wire layer 31c of the third metal electrical wire group is utilized as a read global word line GWL_R. Second metal electrical wire layer 31b and third metal electrical wire layer 31c of the third metal electrical wire group are separated from each second at a predetermined horizontal distance. Configurations shown in FIG. 3a to FIG. 3c are an original patterned configuration in which all layers between first layer and second successive layer are overlapped. However, it is difficult to be distinct from a boundary of various regions in case of the show of the overlapped configuration within FIG. 3a to FIG. 3c. Therefore, the overlapped configuration is not shown in FIG. 3a to FIG. 3c.

FIG. 4a to FIG. 4c are patterned layout configuration diagrams for explaining process steps of other embodiment of a two-port SRAM according to a prior art invention. In other embodiment of the prior art two-port SRAM, a long axis of active regions for forming first and second load transistors TL1 and TL2 is a vertical direction.

In FIG. 4a, an N type well region 42 is formed on first part of a cell formation region 41 in order to define first and second load transistors TL1 and TL2. First and second active regions 44a and 44b is formed so that these active regions 44a and 44b are separated from each second within cell formation region 41. A vertical direction of these active regions 44a and 44b is a long axis. In second region except the N-type well region 42 in the cell formation region 41 which is a P-type well region, third and fourth active regions 44c and 44d which face each second are formed by meeting at least first extension portion to a perpendicular direction from an intersection between a long axis of a horizontal direction and a long axis of a vertical direction. Also, fifth active region 44e is formed on a separation region of first and second active regions 44a and 44b.

Sixth and seventh active regions 44f and 44g are respectively formed on left and right lower portions of third and fourth active regions 44c and 44d. A first metal electrode layer 45a is formed in order to be utilized as gate electrodes of first load transistor TL1, first write drive transistor /WTD1, and first read drive transistor RTD1. First metal electrode layer 45a has a configuration in which a central portion of first active region 44a is passed on in a vertical direction and at least two portions of third active regions 44c are passed on. Second metal electrode layer 45b is formed so that a central portion of second active region 44b is passed on in a horizontal direction and at least two portions of fourth active regions 44d are passed on. As gate electrodes of second load transistor TL2, second write drive transistor WTD2, and second read drive transistor RTD2 functions second metal electrode layer 45b. Third metal electrode layer 45c is formed in order to be utilized as gate electrodes of first and second write access transistors WTA1 and WTA2. Fifth metal electrode layer 45d is formed in order to be utilized as gate electrodes of first and second read access transistors RTA1 and RTA2. A plurality of contact regions 46 are formed on first to seventh active regions 44a to 44g of which any portion are not passed on by first to fourth metal electrode layers 45a to 45d or on first to fourth metal electrode layers 45a to 45d. Fifth active regions 44e is formed in order to define a bias of the N-type well region 42.

In FIG. 4b, first metal electrical wire layer 47a is electrically contacted with first electrodes of first and second load transistor TL1 and TL2. A electrical connection of gate electrodes of first load transistor TL1, first write drive transistor WTD1, and read drive transistor RTD1 and first common node CN1 are made by second metal electrical wire layer 47b. Third metal electrical wire layer 47c causes second common node CN2 to make an electrical connection of gate electrodes of second load transistor TL2, second write drive transistor WTD2, and second read drive transistor RTD2. Fourth metal electrical wire layer 47d which is a horizontal extension, is formed in order to electrically contact with gate electrodes of first and second write access transistor WTA1 and WTA2. In order to electrically contact with gate electrodes of first and second read access transistors RTA1 and RTA2, fifth metal electrical wire layer 47e is formed. Sixth and seventh metal electrical wire layer 47f and 47g are formed in order to electrically contact with first electrodes of first and second write access transistors WTA1 and WTA2. Eighth and ninth metal electrical wire layers 47h and 47i are formed in order to electrically contact with first electrodes of first and second read access transistors RTA1 and RTA2. With third common node CN3 of first write drive transistor WTD1 and first read drive transistor RTD1 is electrically contacted tenth metal electrical wire layer 47j. Eleventh metal electrical wire layer 47k is formed in order to electrically contact with fourth common node CN4 of second write drive transistor WTD2 and second read drive transistor RTD2. Twelfth and thirteenth metal electrical wire layers 47l and 47m are formed in order to contact with power supply ground VSS. First plurality of via holes are respectively formed on sixth to thirteenth metal electrical wire layers 47f to 47m. First metal electrical wire layer of first metal electrical wire group has a first and second active regions 44a and 44b of which a long axis is extended to a vertical direction. Source and drain electrodes are positioned at the same layer as fifth active region 44e, thereby having a straight and vertical extension.

In FIG. 4c, first metal electrical wire layer 49a of second metal electrical wire group is formed so that its electrical wire layers 49a is contacted through first via holes with tenth and twelfth metal electrical wire layers 47j and 47l of first metal electrical wire group to a vertical direction. Second metal electrical wire layer 49b of second metal electrical wire group is formed so that its electrical wire layers 49b is contacted through first via holes with eleventh and thirteenth metal electrical wire layers 47k and 47m of first metal electrical wire group to a vertical direction. Third metal electrical wire layer 49c of second metal electrical wire group is formed so that its electrical wire layers 49c is contacted through first via holes with eighth metal electrical wire layer 47h of first metal electrical wire group to a vertical direction. Fourth metal electrical wire layer 49d of second metal electrical wire group is formed so that its electrical wire layers 49d is contacted through first via holes with ninth metal electrical wire layer 47i of first metal electrical wire group to a vertical direction. Fifth metal electrical wire layer 49e of second metal electrical wire group is formed so that its electrical wire layers 49e is contacted through first via holes with sixth metal electrical wire layer 47f of first metal electrical wire group to a vertical direction. Sixth metal electrical wire layer 49f of second metal electrical wire group is formed so that its electrical wire layers 49f is contacted through first via holes with seventh metal electrical wire layer 47g of first metal electrical wire group to a vertical direction. First metal electrical wire layer 51a of third metal electrical wire group is formed so that its electrical wire layers 51a is contacted through second via holes with first and second metal electrical wire layers 49a and 49b of second metal electrical wire group to a horizontal direction. As a write global word line GWL_W second metal electrical wire layer 51b of the third metal electrical wire group is utilized. Third metal electrical wire layer 51c of the third metal electrical wire group is utilized as a read global word line GWL_R.

In the above-described SRAM, each electrode at the load transistors included in first unit cell and in second unit cell neighbored to the corresponding first unit cell is mutually connected to power supply source line, thereby being happened at the same time at in-operation of all unit cells that are linked to power supply line VCCL. Also, common electrodes of write drive transistor and read drive transistor in every unit cell are electrically connected to power supply ground VSS, such that a problem is happened at the same time at all unit cells that are linked to power supply ground VSS.

Further, the conventional SRAM cell had the second problem that occupation region of a load transistor for obtaining a loading effect is narrow in its width because the width of the load transistor is extended to a vertical direction, resulting in degrading its trust and decreasing its operation speed.

SUMMARY OF THE INVENTION

Accordingly, an object of the present invention is to provide a multi-port SRAM which can reduce an occupation area of first unit cell on a substrate.

Other object of the present invention is to provide a multi-port SRAM which increase an operation speed.

To achieve the above objects, a multi-port SRAM according to the present invention in 2-port static random access memory comprising a first plurality of active regions which are separated from each second within a cell formation region, a first plurality of metal electrode layers which are respectively passed on the first plurality of active regions, and a power supply source which is electrically contacted with first plurality of the metal electrode layers, wherein the metal electrode layers included in first unit cell and in second unit cell neighbored to the corresponding first unit cell of the first plurality of metal electrode layers are commonly connected to the power supply source, having the improvements comprise: a second plurality of active regions formed within the cell formation region, and a second plurality of metal electrode layers to be passed on second plurality of the active regions and to be independently and separately connected to the power supply source, wherein the independence and separation of the connection to the power supply source is between the metal electrode layers included in first unit cell in second plurality of the metal electrode layers and the metal electrode layers included in the second unit cell neighbored to the corresponding first unit cell in second plurality of the metal electrode layers. The upper portion of second plurality of the active regions are respectively and commonly contacted with a write word line and the lower portion of second plurality of the active regions are respectively and commonly contacted with a read word line, only in the first unit cell regardless of second unit cell neighbored to the corresponding first unit cell.

Further, a multi-port SRAM according to the present invention having a plurality of unit cells each includes: a first pair of first and second load transistors having their gate electrode electrodes respectively formed by first and second metal electrode layers on first and second active regions, their first electrodes for being electrically contacted with a power supply voltage, and their second electrodes for being electrically connected to a first pair of first and second common nodes only in first unit cell, regardless of second unit cell neighbored to the corresponding first unit cell; a first pair of first and second write drive transistors having their gate electrodes and first electrodes for being electrically and respectively connected to the corresponding first of first pair of first and second common nodes; a first pair of first and second read drive transistors having their first electrodes for being electrically and respectively connected to the corresponding first of a second pair of third and fourth common nodes, and their gate electrodes for being electrically and respectively connected to the corresponding first of first pair of first and second common nodes; a first pair of first and second write access transistors having their first electrodes for being electrically and respectively connected to the corresponding first of first pair of common nodes, their gate electrodes for being electrically and respectively connected to the corresponding first of second electrodes of the pair of first and second load transistors, and their second electrodes for being electrically and respectively connected to the corresponding first of a pair of write bit lines; a first pair of first and second read access transistors having their gate electrodes for being electrically and respectively connected to the corresponding first of a pair of read word lines, their first electrodes for being electrically and respectively connected to the corresponding first of the pair of first and second read drive transistors, and their second electrodes for being electrically and respectively connected to the corresponding first of a pair of read bit lines; a plurality of active regions formed within the cell formation region; a plurality of metal electrode layers to be passed on the active regions and to be independently and separately connected to the power supply source; a plurality of metal electrical wire groups having: first metal electrical wire group consisting of first metal electrical wire layer for being electrically contacted with the contact regions of said power supply voltage and with first electrodes of first and second load transistors; second and third metal electrical wire layers for being respectively coupled to the corresponding contact region of the write word lines; fourth metal electrical wire layer for being electrically connected to first to third contact regions for first common node; sixth and seventh metal electrical wire layers for being electrically connected to the contact regions of the pair of write bit lines; eighth and ninth metal electrical wire layers for being electrically connected to the corresponding contact region of the read word lines; tenth metal electrical wire layer for being electrically connected to the contact regions of the power supply ground and is extended to the upper side of third active region; and eleventh and twelfth metal electrical wire layers for being electrically connected to the contact regions of the pair of the read bit lines, a second metal electrical wire group consisting of first metal electrical wire layer for being electrically contacted with first metal electrical wire layer of first metal electrical wire group and for being utilized as said power supply voltage; second metal electrical wire layer for being electrically contacted with second and third metal electrical wire layers of first metal electrical wire group; third to fifth metal electrical wire layers for being electrically contacted with second and third metal electrical wire layers of first metal electrical wire group; third to fifth metal electrical wire layers for being electrically contacted with sixth, seventh, and tenth metal electrical wire layers of first metal electrical wire group; sixth metal electrical wire layer for being electrically contacted with eighth and ninth metal electrical wire layers of first metal electrical wire group and for functioning as the corresponding first of the read word lines; and seventh and eighth metal electrical wire layers for being separated from each second and for being electrically contacted with eleventh and twelfth metal electrical wire layers of first metal electrical wire group, and a third metal electrical wire group consisting of first and second metal electrical wire layers for being utilized as the pair of the write bit lines and for being electrically contacted with third and fourth metal electrical wire layers of second metal electrical wire group via a second plurality of via holes; third and fourth metal electrical wire layers for being utilized as the pair of read bit lines and for being electrically contacted with seventh and eighth metal electrical wire layers of second metal electrical wire group; fifth metal electrical wire layers for functioning as the power supply ground and for being electrically contacted with fifth metal electrical wire layer of second metal electrical wire group.

It is to be understood that both the foregoing general description and the following detailed description are exemplary and explanatory and are intended to provide further explanation of the invention as claimed.

BRIEF DESCRIPTION OF THE DRAWINGS

The above objects, features and advantages of the present invention will become more apparent from the following detailed description when taken in conjunction with the accompanying drawings, in which:

FIG. 2a to FIG. 2i are patterned layout configuration diagrams for explaining process steps of one embodiment of a two-port SRAM according to a prior art invention.

FIG. 3a to 3c are patterned layout configuration diagrams for explaining process steps of one embodiment of a two-port SRAM according to a prior art invention, after forming a metal electrical wire.

FIG. 4a to FIG. 4c are patterned layout configuration diagrams for explaining process steps of second embodiment of a two-port SRAM according to a prior art invention.

FIG. 6a to FIG. 6i are layout schematic diagrams for explaining process steps of first embodiment of a multi-port SRAM according to the present invention.

FIG. 7a to FIG. 7c are layout schematic diagrams for explaining process steps of first embodiment of a multi-port SRAM according to the present invention after forming a metal electrical wire.

FIG. 8a to FIG. 8c are layout schematic diagrams for explaining process steps of second embodiment of a multi-port SRAM according to the present invention.

DETAILED DESCRIPTION OF THE PREFERRED EMBODIMENT

Best preferred embodiments of the present invention will now be described with reference to the accompanying drawings. In the accompanying drawings, the same parts as those of the prior art SRAM denote the same symbols as those of the prior art SRAM.

Figure 1:
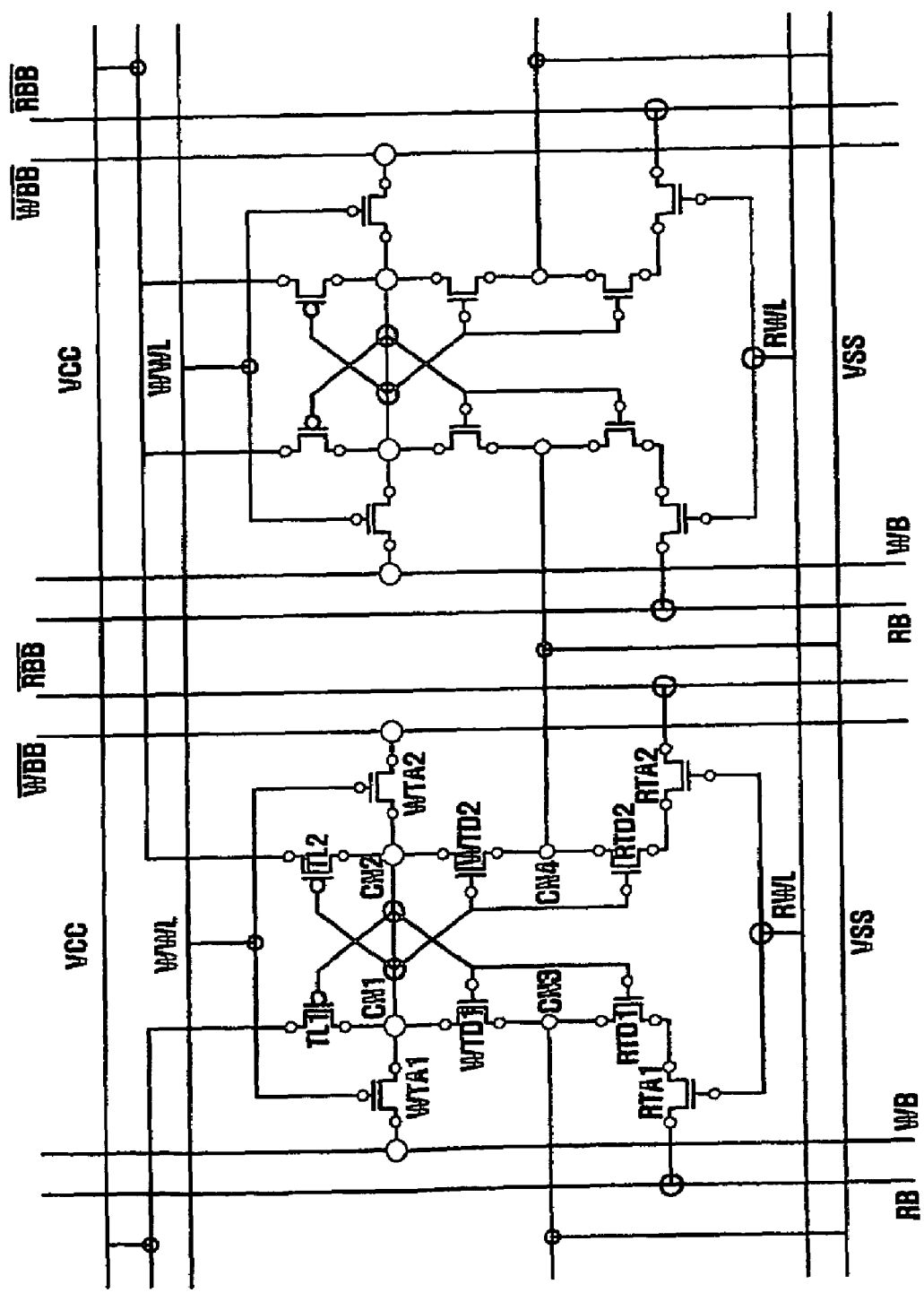
FIG. 1 is a circuit configuration diagram of one embodiment according to a conventional two-port SRAM.
Figure 2A:
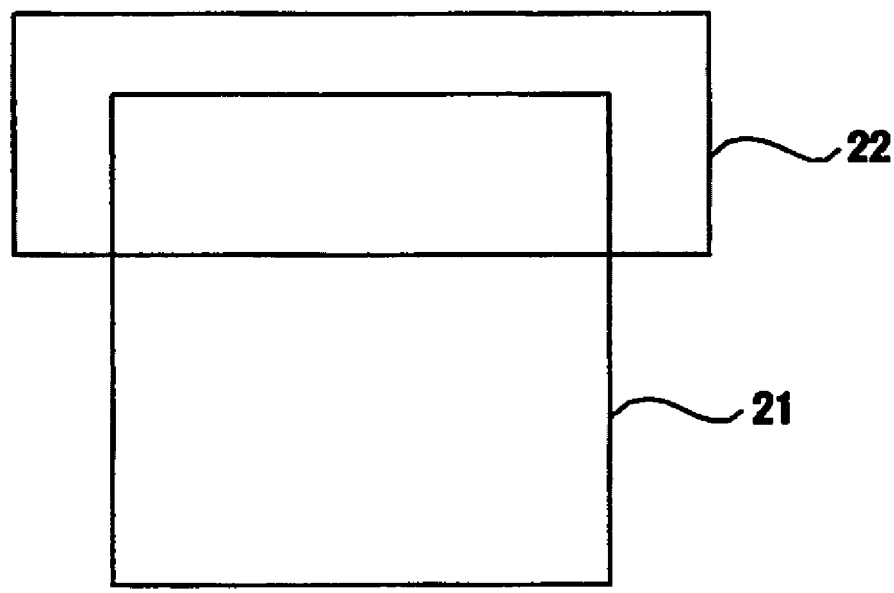
Figure 2C:
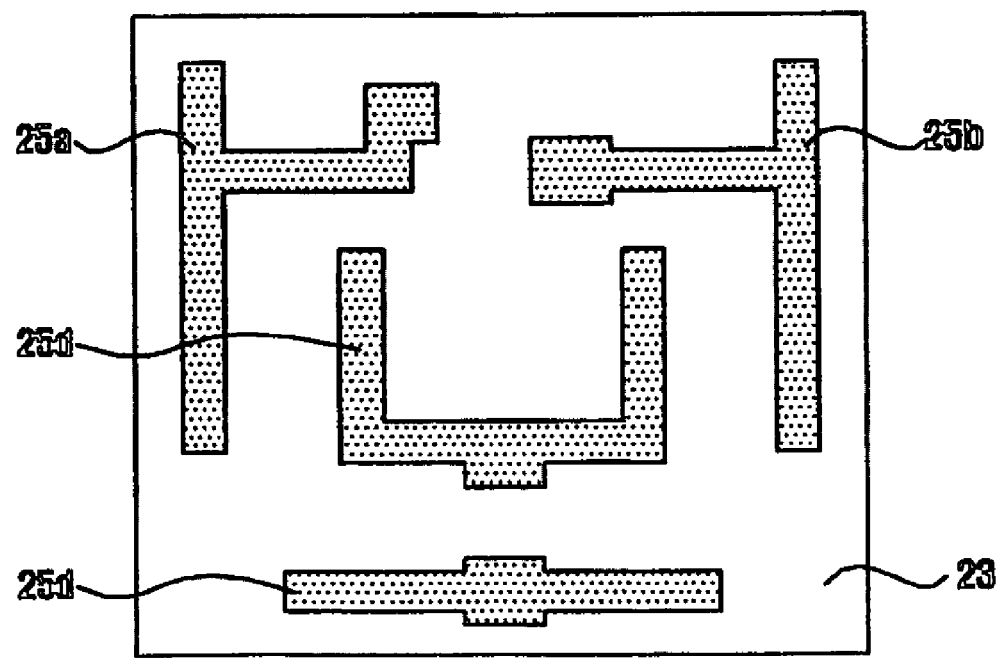
Figure 2E:
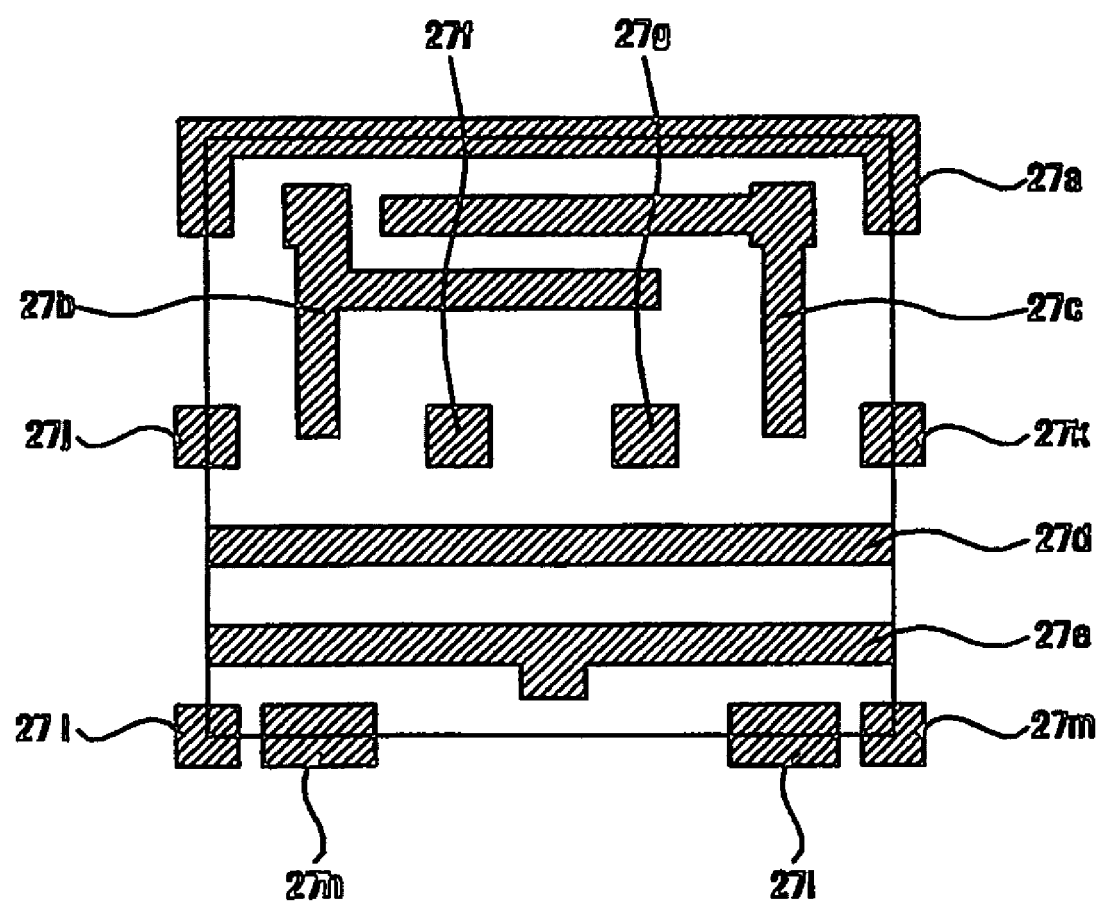
Figure 2F:
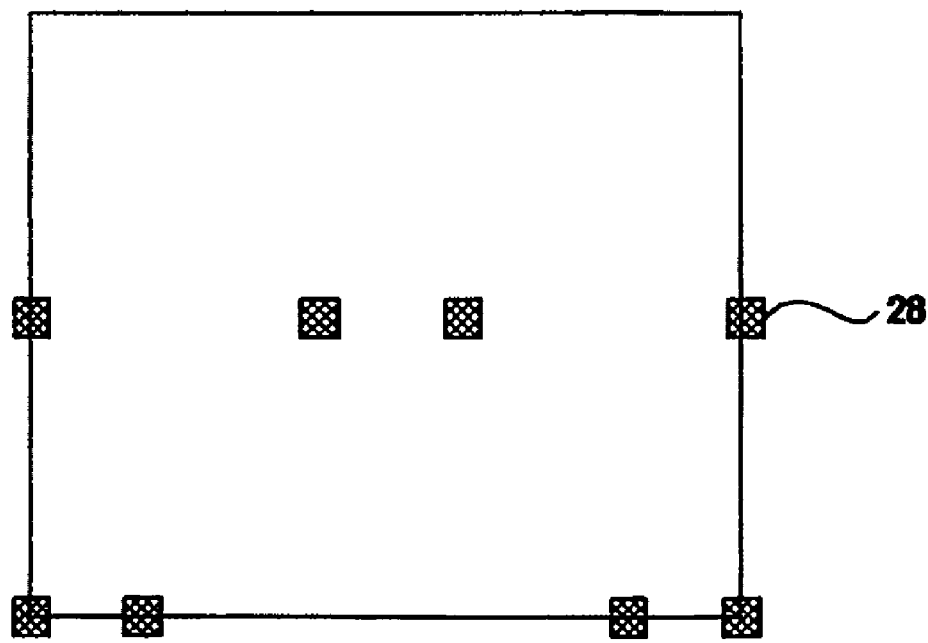
Figure 2H:
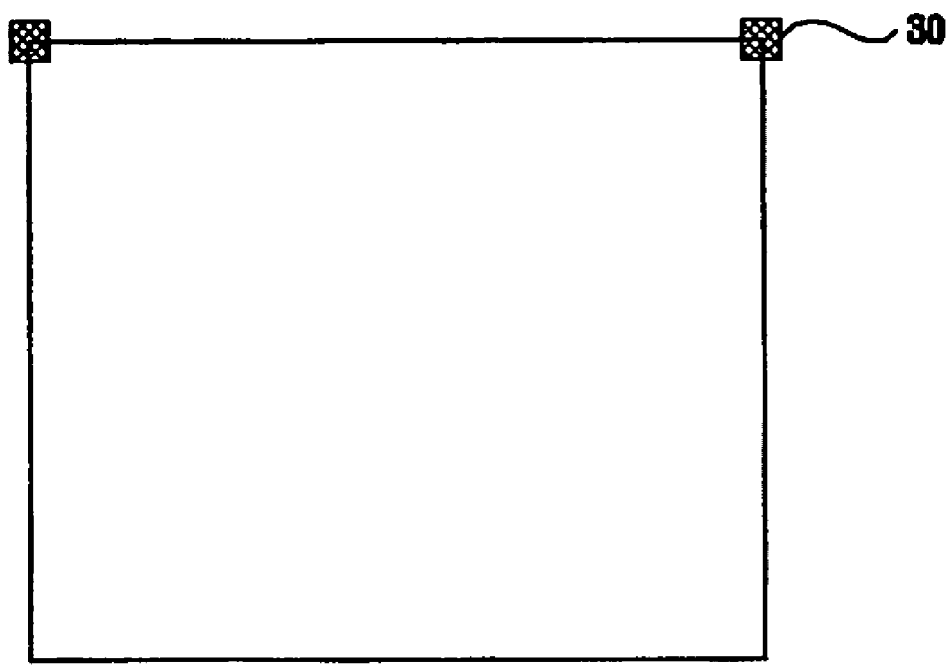
Figure 21:
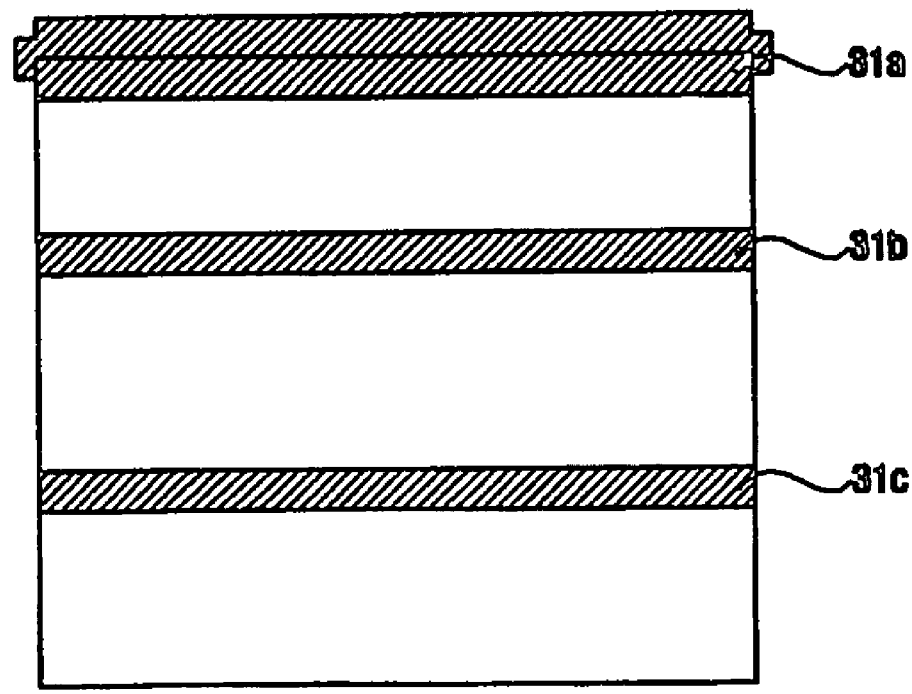
Figure 3A:
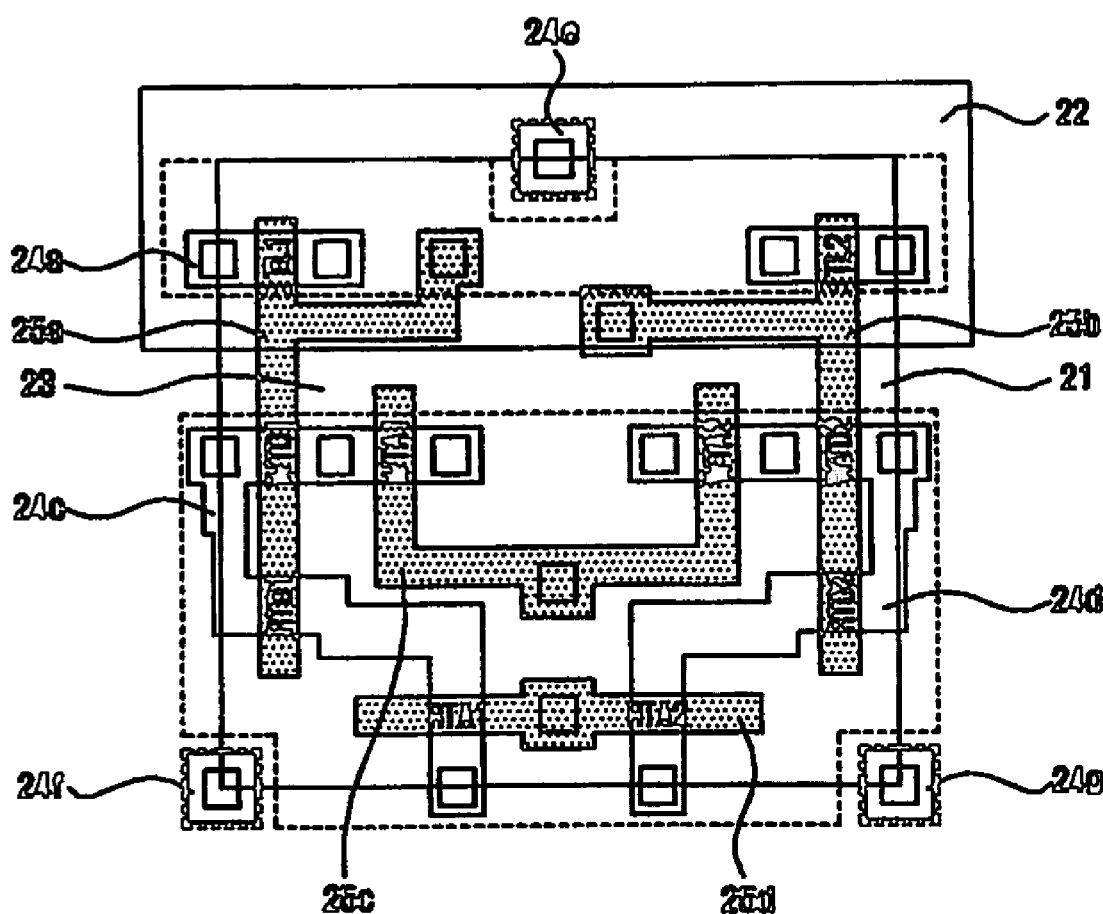
Figure 5:
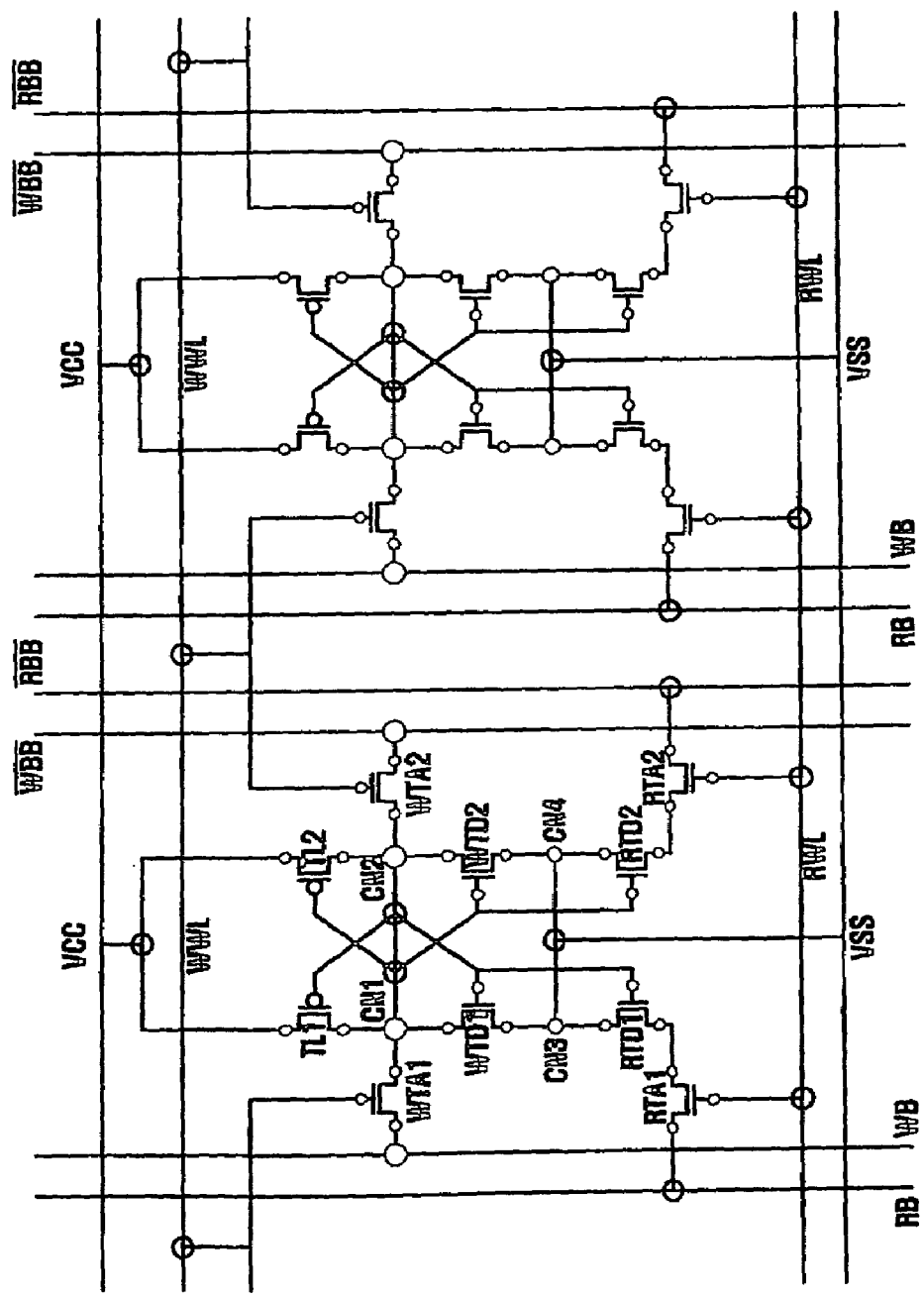
FIG. 5 is a circuit diagram for explaining process steps of first embodiment of a multi-port SRAM according to the present invention.

FIG. 5 is a circuit configuration diagram of one embodiment of a multi-port SRAM according to the present invention.

In FIG. 5, symbol RB denotes a read bit line, symbol /RBB an inverted read bit line, symbol WB a write bit line, symbol /WBB an inverted write bit line, symbol WWL a write word line, symbol RWL a read word line, symbol WTA a write access transistor, symbol RTA a read access transistor, symbol CN a common node, symbol TL load transistor, symbol WTD a write drive transistor, symbol RTD a read drive transistor, symbol VCC a power supply voltage and symbol VSS denotes a power supply ground.

In FIG. 5, a read bit line RB, an inverted read bit line /RBB, a write bit line WB, and an inverted write bit line /WBB included in first unit cell are arranged in a vertical direction. And in the upper part of first unit cell, a power supply voltage VCC and a write word line WWL are arranged in a horizontal direction. In the lower part of first unit cell, power supply ground VSS and a read word line RWL are arranged in a horizontal direction.

Gate electrodes of write access transistors WTA1 and WTA2 included in second unit cell neighbored to the corresponding first unit cell are electrically connected to a write word line WWL, and first electrodes of write access transistors WTA1 and WTA2 are electrically connected to a pair of write bit lines WB and /WBB. Gate electrodes of read access transistors RTA1 and RTA2 are commonly connected to a read word line RWL, and first electrodes of read access transistors RTA1 and RTA2 are connected to a pair of read bit lines RB and /RBB.

Gate electrodes of first and second load transistors TL1 and TL2 are electrically connected to a first pair of common nodes CN1 and CN2, and first electrodes of first and second load transistors TL1 and TL2 are electrically connected to a power supply voltage VCC, independently from second unit cell neighbored to the corresponding first unit cell. Gate electrodes of first write access transistor WTD1 and first read access transistor RTD1 are electrically connected to second common node CN2 and in series to first load transistor TL1. Gate electrodes of second write access transistor WTD2 and second read access transistor RTD2 are electrically connected to first common node CN1 and in series to second load transistor TL2.

In FIG. 5, second electrodes of first load transistor TL1 and first write access transistor WTA1, and first electrode of first write drive transistor WTD1 are electrically connected to first common node CN1. And second electrodes of second load transistor TL2 and second write access transistor WTA2, and first electrode of second write drive transistor WTD2 are electrically connected to second common node CN2. Also, second electrodes of first and second write drive transistors WTD1 and WTD2 and first electrodes of first and second read drive transistors RTD1 and RTD2 are electrically connected to a power supply ground VSS, independently from second unit cell neighbored to the corresponding first unit cell. Further, the second electrodes of first and second read access transistors RTA1 and RTA2 are mutually connected to the second electrodes of first and second read drive transistors RTD1 and RTD2. Wherein first and second load transistors TL1 and TL2 are PMOS transistors, and first second write access transistors WTA1 and WTA2, first and second read access transistors RTA1 and RTA2, first and second write drive transistors WTD1 and WTD2, and first and second read drive transistors RTD1 and RTD2 are respectively a NMOS transistor.

Read and write operations of a multi-port SRAM according to the present invention will be in detail described now.

Supposing that a level of data stored in a unit cell is high, level of an electrical signal at first common node CN1 is high, and therefore a state of second load transistor TL2 is a turn-off. At this time, states of second write drive transistor WTD2 and second read drive transistor RTD2 are respectively a turn-on. Also, level of an electrical signal at first common node CN2 is low and therefore a state of first load transistor TL1 is a turn-on and states of first write drive transistor WTD1 and first read drive transistor RTD1 are respectively a turn-off.

At this situation, when a level of an electrical signal "high" is written into a unit cell a level of an electrical signal at a write word line WWL is high and a level of an electrical signal at a read word line RWL is low, and therefore first and second write access transistors WTA1 and WTA2 are turned on and first and second read access transistors RTA1 and RTA2 are turned off. Successively, a level of an electrical signal at a write bit line WB is low and a level of an electrical signal at an inverted write bit line /WBB is high. At this time, a level of an electrical signal at first common node CN1 is low via first write access transistor WTA1 because a current driving function of first load transistor TL1 is worse than that of first write access transistor WTA1, and therefore second load transistor TL2 is turned on and second read drive transistor RTD2 is turned off. Resultantly, a level of an electrical signal at second common node CN2 is high, first load transistor TL1 is turned off, and first write drive transistor WTD1 and first read drive transistor RTD1 are continue to be turned on. And level of data to be stored in a unit cell is "0". A completion of a write operations of a multi-port SRAM according to the present invention is made. In case of a read operations of a multi-port SRAM according to the present invention, if a unit cell is selected in order to read-out a stored data "0" from a selected unit cell of a cell array a level of a read word line RWL is high and a level of a write word line WWL is low. Therefore, first and second read access transistors RTA1 and RTA2 are turned on and first and second write access transistors WTA1 and WTA2 are turned off A level of an electrical signal at first common node CN1 is low and a level of an electrical signal at second common node CN2 is high because a level of data stored in a cell is "0". Also, second load transistor TL2 is turned on and second write drive transistor WTD2 and second read drive transistor RTD2 are continue to be turned off. And first write drive transistor WTD1 and first read drive transistor RTD1 are continue to be turned on. Trough first read access transistor RTA1 and first read drive transistor RTD1 a read bit line RB is low. By the turned-off state of second read drive transistor RTD2, a level of an inverted read bit line /RBB is high. The stored data "0" from the selected unit cell of a cell array is red-out by sensing a difference of voltages on a pair of read bit lines RB and /RBB.

FIG. 6a to FIG. 6i are schematic layout diagrams for explaining process steps of one embodiment of a multi-port SRAM according to the present invention.

Figure 6A:
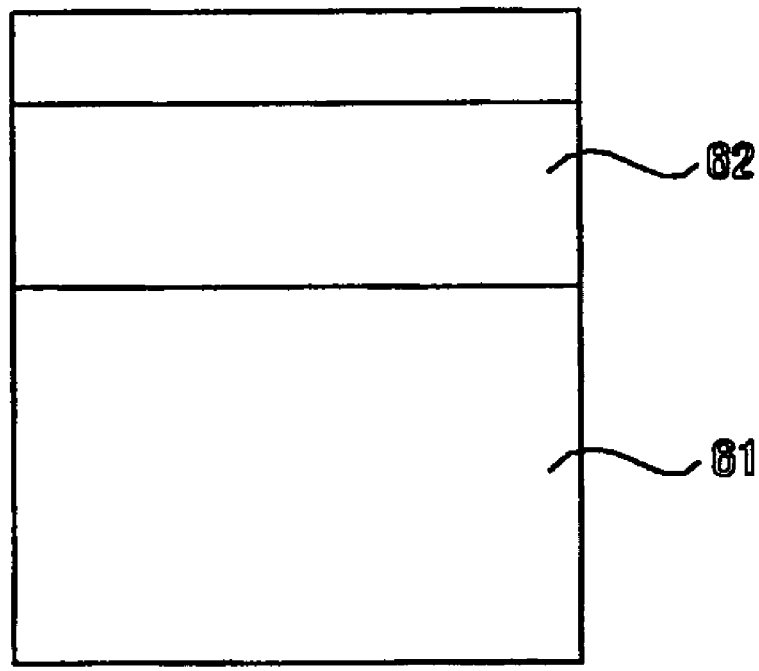

In FIG. 6a, an N-type well region 62 is formed within first region of a cell formation region 61 in order to function as a pair of first and second load transistors TL1 and TL2. Some region except the N-type well region 62 within the cell formation region 61 indicate a P-type well region.

As known from FIG. 6b, a formation of first to thirteen active regions 64a to 64m is made by a separation of second region (not shown) from a field region 63 in the cell formation region 61. Of first to thirteen active regions 64a to 64m, first, second and fourth active regions 64a, 64b, and 64d are independently separated from each second and second regions except the above active regions 64c, 64e, 64f, 64g, 64h, 64i, 64j, 64k, 64l, and 64m are dependently integrated from each second. First metal electrode layer 65a has a configuration in which its two portions are perpendicular to each second and at least first portion of first, third, and sixth active regions 64a, 64c, and 64f are passed on. Second metal electrode layer 65b is formed so that it may have a symmetrically mutual face configuration with first metal electrode layer 65a and at least first portion of second, third, seventh active regions 64b, 64c, and 64g may be passed on. Third metal electrode layer 65c is formed so that any portion of third active region 64c is passed on. Fourth metal electrode layer 65d is formed so that any portion of third active region 64c may be passed on. Fifth metal electrode layer 65e is formed so that any portion of tenth active region 64j may be passed on. Sixth metal electrode layer 65f is formed so that it may have a symmetrically mutual face configuration with fifth metal electrode layer 65e and at least any portion of eleventh active regions 64k may be passed on.

Using the metal electrode layers, the impurities regions (not shown) are formed within the surface of exposed active regions.

Figure 6D:
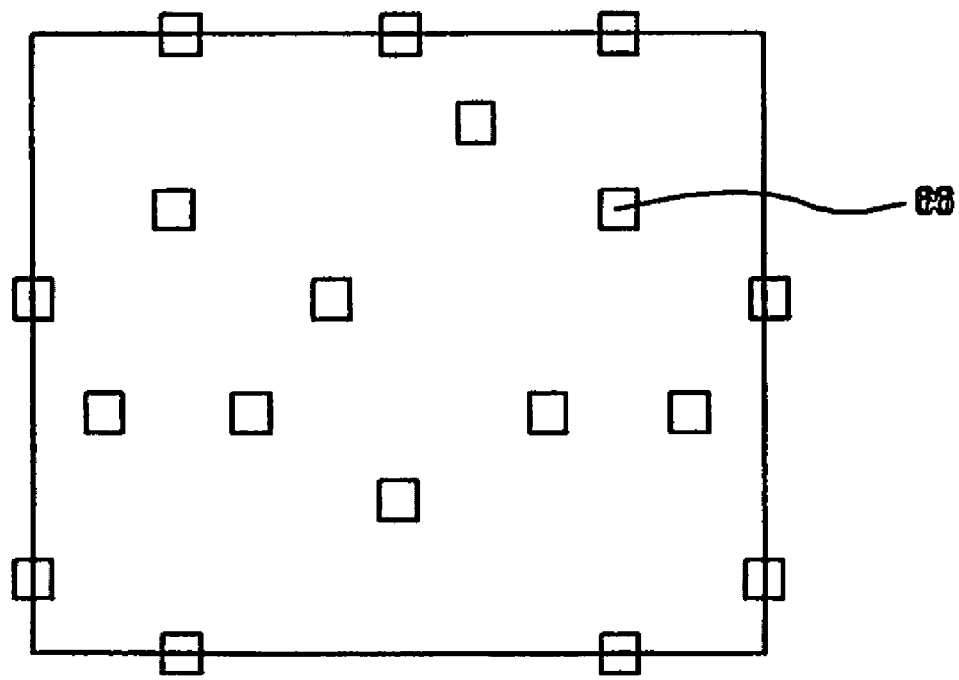

In FIG. 6d, for the purpose of selectively exposing the impurities regions or the metal electrode layers, a plurality of contact regions 66 are formed. Over the plurality of contact regions 66 is formed an interleave layer insulation which is selectively etched.

At this situation on the completion of formation of the contact regions, entire layout configuration will be described below.

Figure 7A:
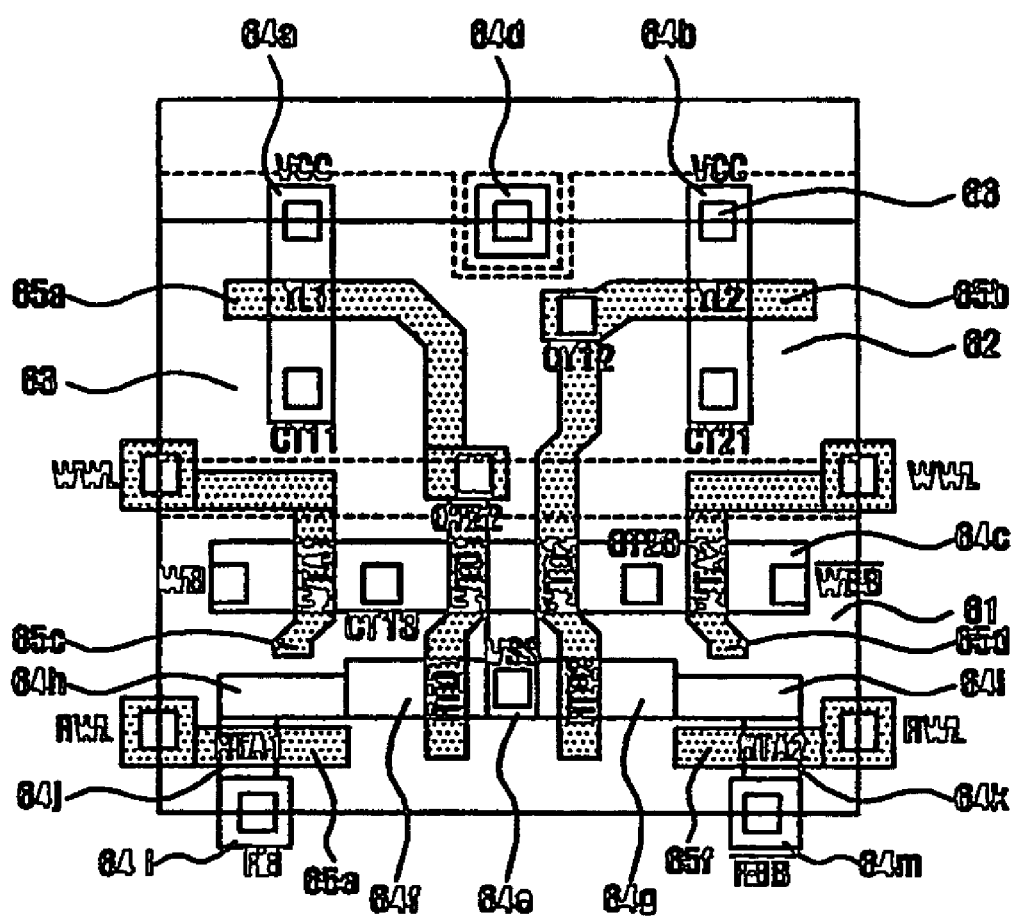

As shown in FIG. 7a, an N-type well region 62 is formed within some of a cell formation region 61 in order to function as a pair of first and second load transistors TL1 and TL2. First and second active regions 64a and 64b have their long axes which are perpendicular to a vertical direction in the cell formation region 61 and are separated from each second at an opposition. On the central portion of P type well region which is second region except the N type well region 62 within the cell formation region 61 are third active region 64c which has its long axis in a horizontal direction. Also, fourth active region 64d is a separation region between first and second active regions 64a and 64b. Fifth active region 64e is formed to be extended from the central lower portion of third active region 64c to a vertical direction. At the lower portion of fifth active region 64e, sixth and eighth active regions 64f and 64h are respectively extended to its left side in a horizontal direction and seventh and ninth active regions 64g and 64i are respectively extended to its right side in a horizontal direction. Tenth and twelfth active regions 64j and 64l and eleventh and thirteen active regions 64m and 64k have a symmetrically face configuration at an opposition. These active regions 64j and 64l are respectively extended to their lower portions to be vertical against eighth active region 64h. These active regions 64m and 64k are respectively extended to their lower portions to be vertical against seventh active region 64g. As gate electrodes of first load transistor TL1, first write drive transistor WTD1, and first read drive transistor RTD1 is utilized first metal electrode layer 65a which includes a first part to pass on the central of first active region 64a in a horizontal direction and a second part to pass on the first part in vertical direction. Second metal electrode layer 65b has a face configuration against first metal electrode layer 65a. As gate electrodes of second load transistor TL2, second write drive transistor WTD2, and second read drive transistor RTD2 is utilized second metal electrode layer 65b which passes on the central of second active region 64b in a horizontal direction and cross-passes on third and sixth active regions 64c and 64f in vertical direction. Third and fourth metal electrode layers 65c and 65d are utilized as gate electrodes of first and second write access transistors WTA1 and WTA2 which cross-passes third active access transistor 64c through their both sides on basis of first and second metal electrode layers 65a and 65b. Fifth and sixth metal electrode layers 65e and 65f are utilized as gate electrode electrodes of first and second access transistors RTA1 and RTA2 which have a configuration in which tenth and eleventh active regions 64j and 64k are cross-passed in a horizontal direction. First to third contact regions CT11, CT12, and CT13 for first common node CN1 are respectively formed on third active region 64c of first electrodes of third metal electrode layer 65c, the upper portion of second metal electrode layer 65b, first active region 64a of second electrode of first metal electrode layer 65a, and the contact region of a power supply voltage VCC formed on first and second active regions 64a and 64b and fourth active region 64d of first and second metal electrode layers 65a and 65b. First to third contact regions CT21, CT22, and CT23 for second common node CN2 are respectively formed on third active region 64c of first electrodes of fourth metal electrode layers 65d, the upper portion of first metal electrode layer 65a, and second active region 64b of second electrode of second metal electrode layer 65b. Contact regions of a pair of write bit lines WB and /WBB are respectively formed on third active region 64c of second electrodes of third and fourth metal electrode layers 65c and 65d.

Contact regions of a write word line WLL are respectively positioned at the edge of the cell formation region 61 and are respectively formed on the end portion of third and fourth metal electrode layers 65c and 65d. Contact regions of a power supply ground VSS are formed on fifth active region 64e. Contact regions of a read word line RWL are respectively positioned at the edge of the cell formation region 61 and are respectively formed on the end portion of fifth and sixth metal electrode layers 65e and 65f. Contact regions of a pair of read bit lines RB and /RBB are respectively formed on twelfth and thirteen active regions 64l and 64m of first electrodes of fifth and sixth metal electrode layers 65e and 65f. Fourth active region 64d is a region for mediating a well bias of the N-type well region. On the completion of the process step of the above described layout configuration as shown in FIG. 7a, first metal electrical wire layer 67a of first metal electrical wire group for functioning as a power supply voltage VCC and second to twelfth metal electrical wire layers 67b to 67l of first metal electrical wire group are formed as shown in FIG. 6e.

Figure 6F:
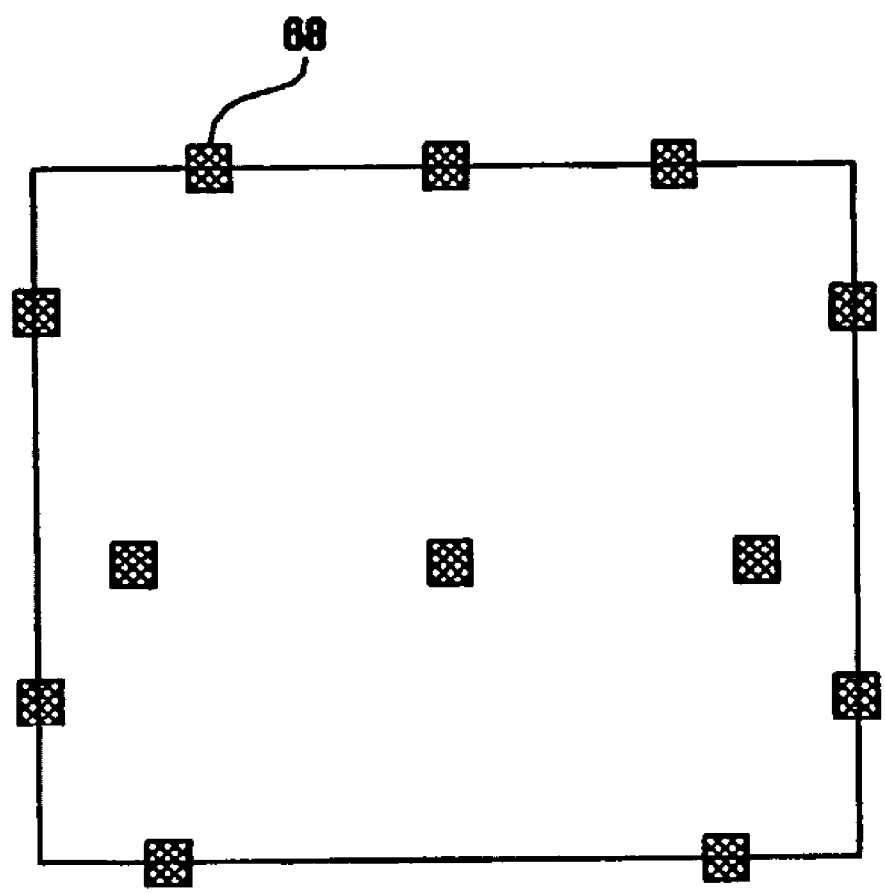

In FIG. 6f, a plurality of via holes are formed on the active regions and the metal electrical wire layers of first metal electrical wire group.

Figure 6G:
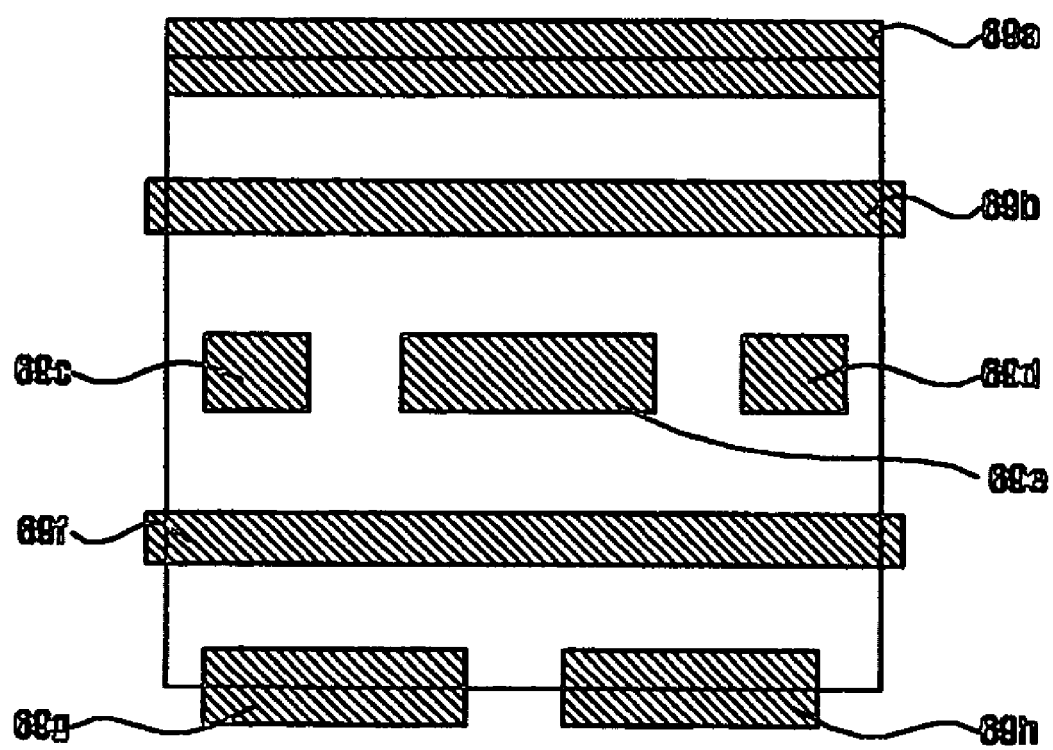
Figure 6H:
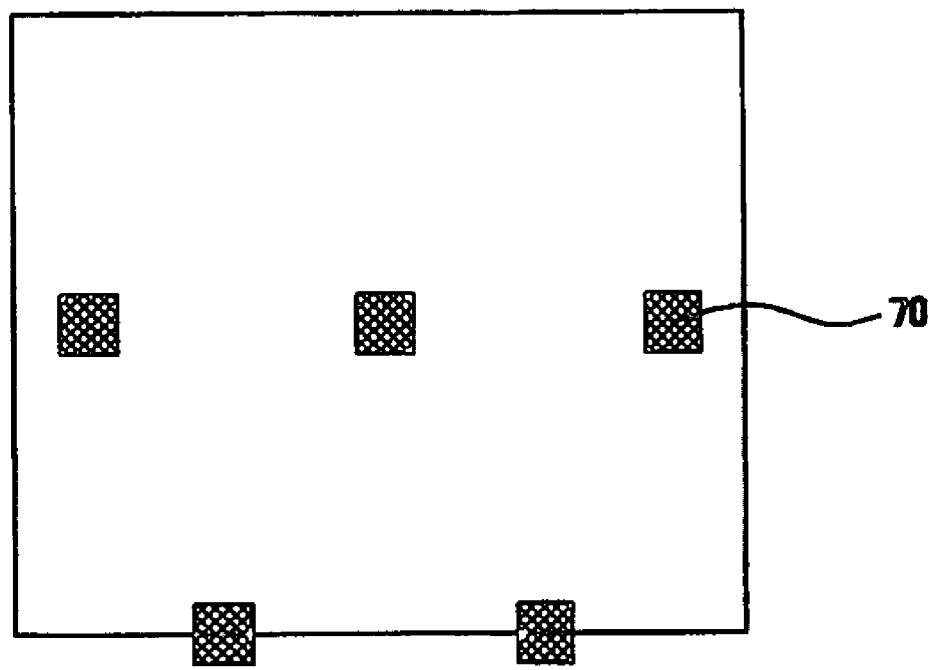

In FIG. 7b, first metal electrical wire layer 67a of first metal electrical wire group is electrically contacted with contact regions of a power supply voltage VCC of fourth active region 64d and first electrodes of first and second load transistors TL1 and TL2. Second and third metal electrical wire layer 67b and 67c of first metal electrical wire group are respectively coupled to a contact region of a write word line WWL. Fourth metal electrical wire layer 67d of first metal electrical wire group is electrically connected to first to third contact regions CT11, CT12, and CT13 for first common node CN1. Sixth and seventh metal electrical wire layers 67f and 67g of first metal electrical wire group are electrically connected to contact regions of a pair of write bit lines WB and /WBB. Eighth and ninth metal electrical wire layers 67h and 67j of first metal electrical wire group are electrically connected to contact region of a read word line RWL. Tenth metal electrical wire layer 67j of first metal electrical wire group is electrically connected to contact regions of a power supply ground VSS and is extended to the upper side of third active region 64c. Eleventh and twelfth metal electrical wire layers 67k and 67l of first metal electrical wire group are electrically connected to contact regions of a pair of read bit lines RB and /RBB. A first plurality of via holes 68 are formed on first to twelfth metal electrical wire layers 67a to 67l of first metal electrical wire group. After carrying out the process step of the above described layout configuration as shown in FIG. 7a, first to eighth metal electrical wire layers 69a to 69h of second metal electrical wire group for functioning as a power supply voltage VCC, a write word line WWL, and a read word line RWL are formed as shown in FIG. 6g. A second plurality of via holes 70 are formed on third to eighth metal electrical wire layers 69c to 69h. Successively, first to sixth metal electrical wire layers 71a to 71e are formed in a vertical direction as shown in FIG. 6i.

In FIG. 7c, first metal electrical wire layer 69a of second metal electrical wire group is electrically contacted with first metal electrical wire layer 67a of first metal electrical wire group and is utilized as a power supply voltage VCC. Second metal electrical wire layer 69b of second metal electrical wire group is electrically contacted with second and third metal electrical wire layers 67b and 67c of first metal electrical wire group. Third to fifth metal electrical wire layer 69c to 69e of second metal electrical wire group are electrically contacted with sixth, seventh, and tenth metal electrical wire layers 67f, 67g, and 67j of first metal electrical wire group. Sixth metal electrical wire layer 69f of second metal electrical wire group is electrically contacted with eighth and ninth metal electrical wire layers 67h and 67i of first metal electrical wire group for functioning as a read word line RWL. Seventh and eighth 69g and 69h are separated from each second and are electrically contacted with eleventh and twelfth. A second plurality of via holes 70 are formed on third, fourth, fifth, seventh, and eighth metal electrical wire layers 69c, 69d, 69e, 69g, and 69h.

First and second metal electrical wire layers 71a and 71b of third metal electrical wire group for being utilized as a pair of write bit lines WB and /WBB are electrically contacted with third and fourth metal electrical wire layers 69c and 69d of second metal electrical wire group via the second plurality of via holes. Third and fourth metal electrical wire layers 71c and 71d of third metal electrical wire group for being utilized as a pair of read bit lines RB and /RBB are electrically contacted with seventh and eighth metal electrical wire layers 69g and 69h of second metal electrical wire group. Fifth metal electrical wire layers 71e of third metal electrical wire group for functioning as a power supply ground VSS is electrically contacted with fifth metal electrical wire layer 69e of second metal electrical wire group. Configurations shown in FIG. 7a to FIG. 7c are an original patterned configuration in which all layers between first layer and second successive layer are overlapped. However, it is difficult to distinct from a boundary of various regions in case of the show of the overlapped configuration within FIG. 7a to FIG. 7c. Therefore, the overlapped configuration is not shown in FIG. 7a to FIG. 7c.

Figure 8A:
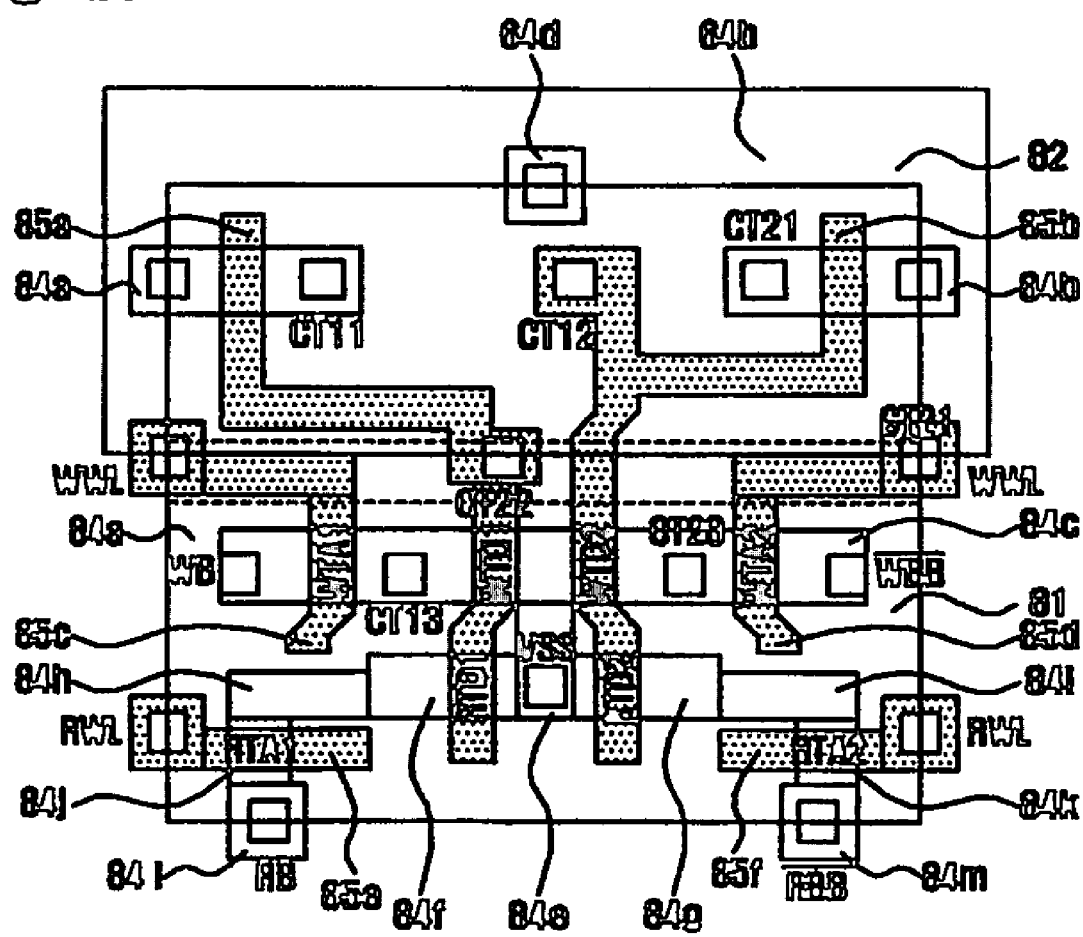
Figure 8C:
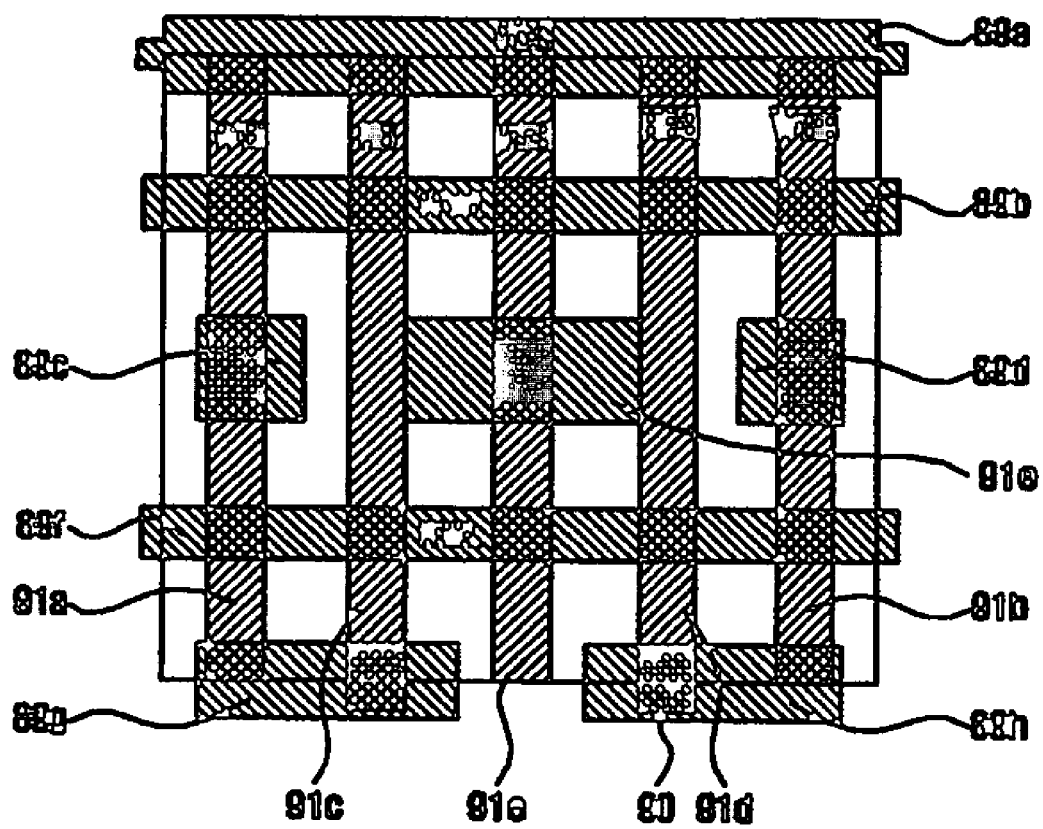

FIG. 8a to FIG. 8c are schematic layout diagrams for explaining process steps of second embodiment of a multi-port SRAM according to the present invention.

In second embodiment of a multi-port SRAM according to the present invention, long axes of the active regions for functioning as first and second load transistors TL1 and TL2 are a horizontal direction. Also, only a vertical direction is a direction at which first and second metal electrical wire layers 85a and 85b pass on the active regions. In first embodiment of a multi-port SRAM according to the present invention, however, any portions of which the metal electrical wire layers pass on the active regions are formed in a vertical direction and a perpendicular direction to a horizontal direction. Only a vertical direction at which the metal electrical wire layers pass on the active regions is embodied in second embodiment of a multi-port SRAM according to the present invention.

As known in FIG. 8a, an N-type well region 82 is formed within some of a cell formation region 81 in order to define regions of a pair of first and second load transistors TL1 and TL2. First and second active regions 84a and 84b have their long axes which are parallel with a horizontal direction in the cell formation region 81 and are separated from each second at an opposition. On the central portion of P-type well region which is second region except the N type well region 82 within the cell formation region 81 are third active region 84c which has its long axis in a horizontal direction. Also, fourth active region 84d is a separation region between first and second active regions 84a and 84b. Fifth active region 84e is formed to be extended from the central lower portion of third active region 84c to a vertical direction. At the lower portion of fifth active region 84e, sixth and eighth active regions 84f and 84h are respectively extended to its left side in a horizontal direction and seventh and ninth active regions 84g and 84i are respectively extended to its right side in a horizontal direction. Tenth and twelfth active regions 84j and 84l and eleventh and thirteen active regions 84m and 84k have a symmetrically face configuration at an opposition. These active regions 84j and 84l are respectively extended to their lower portions to be vertical against eighth active region 84h. These active regions 84m and 84k are respectively extended to their lower portions to be vertical against seventh active region 84g. As gate electrodes of first load transistor TL1, first write drive transistor WTD1, and first read drive transistor RTD1 is utilized first metal electrode layer 85a which includes a first part to pass on the central of first active region 84a in a horizontal direction, a second part to be extended to the first part in a horizontal direction, and a third part to be passed on perpendicularly to the second part in a vertical direction. Second metal electrode layer 85b has a face configuration against first metal electrode layer 85a. As gate electrodes of second load transistor TL2, second write drive transistor WTD2, and second read drive transistor RTD2 is utilized second metal electrode layer 85b which passes on the central of second active region 84b in a horizontal direction and cross-passes on third and sixth active regions 84c and 84f in a vertical direction. Third and fourth metal electrode layers 85c and 85d are utilized as gate electrodes of first and second write access transistors WTA1 and WTA2 which cross-passes third active access transistor 84c through their both sides on basis of first and second metal electrode layers 85a and 85b. Fifth and sixth metal electrode layers 85e and 85f are utilized as gate electrodes of first and second access transistors RTA1 and RTA2 and have a configuration in which tenth and eleventh active regions 84j and 84k are cross-passed in a horizontal direction.

First to third contact regions CT11, CT12, and CT13 for first common node CN1 are respectively formed on third active region 84c of first electrodes of third metal electrode layer 85c, the upper portion of second metal electrode layer 85b, first active region 84a of second electrode of first metal electrode layer 85a, and the contact region of a power supply voltage VCC formed on first and second active regions 84a and 84b and fourth active region 84d of first and second metal electrode layers 85a and 85b. First to third contact regions CT21, CT22, and CT23 for second common node CN2 are respectively formed on third active region 84c of first electrodes of fourth metal electrode layers 85d, the upper portion of first metal electrode layer 85a, and second active region 84b of second electrode of second metal electrode layer 85b. Contact regions of a pair of write bit lines WB and /WBB are respectively formed on third active region 84c of second electrodes of third and fourth metal electrode layers 85c and 85d. Contact regions of a write word line WLL are respectively positioned at the edge of the cell formation region 61 and are respectively formed on the end portion of third and fourth metal electrode layers 85c and 85d. Contact regions of a power supply ground VSS are formed on fifth active region 84e. Contact regions of a read word line RWL are respectively positioned at the edge of the cell formation region 81 and are respectively formed on the end portion of fifth and sixth metal electrode layers 85e and 85f. Contact regions of a pair of read bit lines RB and /RBB are respectively formed on twelfth and thirteen active regions 84l and 84m of first electrodes of fifth and sixth metal electrode layers 85e and 85f. Fourth active region 84d is a region for mediating a well bias of the N-type well region.

Entire layout configuration of first metal electrical wire group is similar like those shown in FIG. 7b, but metal electrical wire laid out configuration for being electrically provided with a power supply voltage VCC are very different. This difference appears on that the metal electrode layers of first and second load transistors TL1 and second formed on first and second active regions 84a and 84b are not positioned at the same horizontal direction as fourth active region 84d by the variation of a long axis of first and second active regions 84a and 84b. Therefore, the metal electrical wire laid out configuration has a vertical part to be perpendicular to the edge of the cell formation region 81.

In FIG. 8b, first metal electrical wire layer 87a of first metal electrical wire group is electrically contacted with contact regions of a power supply voltage VCC of fourth active region 84d and first electrodes of first and second load transistors TL1 and TL2. Second and third metal electrical wire layers 87b and 87c of first metal electrical wire group are respectively coupled to a contact region of a write word line WWL. Fourth metal electrical wire layer 87d of first metal electrical wire group is electrically connected to first to third contact regions CT11, CT12, and CT13 for first common node CN1. Sixth and seventh metal electrical wire layers 87*f* and 87*g* of first metal electrical wire group are electrically connected to contact regions of a pair of write bit lines WB and /WBB. Eighth and ninth metal electrical wire layers 87*h* and 87*j* of first metal electrical wire group are electrically connected to contact region of a read word line RWL. Tenth metal electrical wire layer 87*j* of first metal electrical wire group is electrically connected to contact regions of a power supply ground VSS and is extended to the upper side of third active region 84*c*. Eleventh and twelfth metal electrical wire layers 87*k* and 87*l* of first metal electrical wire group are electrically connected to contact regions of a pair of read bit lines RB and /RBB. A first plurality of via holes 88 are formed on first to twelfth metal electrical wire layers 87*a* to 87*l* of first metal electrical wire group.

In FIG. 8*c*, first metal electrical wire layer 89*a* of second metal electrical wire group is electrically contacted with first metal electrical wire layer 87*a* of first metal electrical wire group and is utilized as a power supply voltage VCC. Second metal electrical wire layer 89*b* of second metal electrical wire group is electrically contacted with second and third metal electrical wire layers 87*b* and 87*c* of first metal electrical wire group. Third to fifth metal electrical wire layer 89*c* to 89*e* of second metal electrical wire group are electrically contacted with sixth, seventh, and tenth metal electrical wire layers 87*f*, 87*g*, and 87*j* of first metal electrical wire group. Sixth metal electrical wire layer 89*f* of second metal electrical wire group is electrically contacted with eighth and ninth metal electrical wire layers 87*h* and 87*i* of first metal electrical wire group for functioning as a read word line RWL. Seventh and eighth 89*g* and 89*h* are separated from each second and are electrically contacted with eleventh and twelfth metal electrical wire layers 87*h* and 87*i* of first metal electrical wire group. A second plurality of via holes 90 are formed on third, fourth, fifth, seventh, and eighth metal electrical wire layers 89*c*, 89*d*, 89*e*, 89*g*, and 89*h*.

First and second metal electrical wire layers 91*a* and 91*b* of third metal electrical wire group for being utilized as a pair of write bit lines WB and /WBB are electrically contacted with third and fourth metal electrical wire layers 89*c* and 89*d* of second metal electrical wire group via the second plurality of via holes. Third and fourth metal electrical wire layers 91*c* and 91*d* of third metal electrical wire group for being utilized as a pair of read bit lines RB and /RBB are electrically contacted with seventh and eighth metal electrical wire layers 89*g* and 89*h* of second metal electrical wire group. Fifth metal electrical wire layers 91*e* of third metal electrical wire group for functioning as a power supply ground VSS is electrically contacted with fifth metal electrical wire layer 89*e* of second metal electrical wire group.

In embodiments of a multi-port SRAM according to the present invention, a number of contact regions to be positioned at the same horizontal direction are limited to for example 6, rather than 4 or 5. Moreover, it is to obtain a necessary margin of a layout configuration on a cell array by the above limitation, or by making contact regions of a power supply ground VSS to be positioned at the lower of drive transistor within a cell formation region. Further, contact regions of a power supply voltage VCC and a power supply ground VSS included in first unit cell and in second unit cell neighbored to the corresponding first unit cell are independently formed by a unit cell of a cell array, thereby being happened only at in-operation of first unit cell, regardless of second unit cell neighbored to the corresponding first unit cell in case of the electrical disconnection of contact regions of the power supply source VCC and VSS to metal electrode layers within the corresponding first unit cell.

According to a multi-port SRAM of the present invention, obtainment of a necessary margin of a layout configuration on a cell array is to be able to reduce an occupation area of a memory cell on a substrate. A width of occupation region of load transistors is extended to a vertical direction, resulting in degrading its trust and decreasing its operation speed.

What is claimed is:

1. A multi-port static random access memory comprising:
a first plurality of active regions which are separated from each other within a cell formation region having a first unit cell and a second unit cell neighboring the first unit cell;
a first plurality of metal electrode layers which are respectively passed on the first plurality of said active regions;
a power supply source which is electrically contacted with the first plurality of said metal electrode layers, wherein the first plurality of said metal electrode layers included in first unit cell and in the second unit cell are commonly connected to said power supply source;
a second plurality of active regions formed within the cell formation region in the first and second unit cells; and
a second plurality of metal electrode layers to be passed on the second plurality of said active regions such that the second plurality of said metal electrode layers in the first cell unit are connected to the power source independently and separately from the second plurality of said metal electrode layers in the second unit cell.

2. A multi-port static random access memory according to claim 1 wherein long axes of some of said active regions in the second plurality of said active regions are respectively extended to a vertical direction.

3. A multi-port static random access memory according to claim 1 wherein some of the second plurality of said active regions are integrated with each other.

4. A multi-port static random access memory according to claim 3 wherein long axes of the integrated active regions in the second plurality of said active regions are respectively extended to a horizontal direction.

5. A multi-port static random access memory according to claim 1 wherein an upper portion of the second plurality of said active regions are respectively and commonly contacted with a write word line only in the first unit cell, regardless of the second unit cell neighbored to the corresponding first unit cell.

6. A multi-port static random access memory according to claim 1 wherein a lower portion of the second plurality of said active regions are respectively and commonly contacted with a read word line only in the first unit cell, regardless of the second unit cell neighbored to the corresponding first unit cell.

7. A multi-port static random access memory according to claim 1 wherein a number of contact regions on the second plurality of said active regions are smaller than a number of contact regions on the first plurality of said active regions, in a horizontal direction.

8. A multi-port static random access memory comprising a plurality of unit cells each including:
a first pair of first and second load transistors having their gate electrodes respectively formed by first and second metal electrode layers on first and second active regions, their first electrodes for being electrically contacted with a power supply voltage, and their second electrodes for being electrically connected to a first pair of first and second common nodes only in a first unit cell, regardless of a second unit cell neighbored to the corresponding first unit cell;

a first pair of first and second write drive transistors having their gate electrodes and first electrodes for being electrically and respectively connected to a corresponding one of the first pair of and second common nodes;

a first pair of first and second read drive transistors having their first electrodes for being electrically and respectively connected to a corresponding one of a second pair of third and fourth common nodes, and their gate electrodes for being electrically and respectively connected to the corresponding first of the pair of said first and second common nodes;

a first pair of first and second write access transistors having their first electrodes for being electrically and respectively connected to the corresponding one of the first pair of said first and second common nodes, their gate electrodes for being electrically and respectively connected to the corresponding one of the second electrodes of the first pair of said first and second load transistors, and their second electrodes for being electrically and respectively connected to a corresponding first of a pair of write bit lines; and a first pair of first and second read access transistors having their gate electrodes for being electrically and respectively connected to a corresponding one of a pair of read word lines, their first electrodes for being electrically and respectively connected to the corresponding one of the first pair of first and second read drive transistors, and their second electrodes for being electrically and respectively connected to a corresponding one of a pair of read bit lines.

9. A multi-port static random access memory according to claim 8, wherein the second electrodes of the first pair of said first and second write access transistors included in first unit cell of the plurality of said unit cells are electrically coupled to the corresponding second electrodes of a second pair of write access transistors included in a second unit cell neighbored to the corresponding first unit cell of the plurality of said unit cells, and the second electrodes of the first pair of said first and second read access transistors included in the first unit cell of the plurality of said unit cells are electrically coupled to the corresponding second electrodes of a second pair of read access transistors included in the second unit cell neighbored to the corresponding first unit cell of the plurality of said unit cells.

10. A multi-port static random access memory according to claim 8, wherein each of said unit cells further includes a plurality of active regions formed within a cell formation region, and a plurality of metal electrode layers to be passed on the plurality of said active regions and to be independently and separately connected to said power supply voltage.

11. A multi-port static random access memory according to claim 10, wherein the plurality of said active regions includes first, second, and fourth active regions for being independently separated from each of the other active regions and other ones of the plurality of active regions for being dependently integrated with each other.

12. A multi-port static random access memory according to claim 11, wherein the plurality of metal electrode layers include:

said first metal electrode layer having a configuration in which its two portions are perpendicular to each other and at least a first portion of said first, a third, and a sixth active regions are passed on, a said second metal electrode layer for being formed so that it has a symmetrically mutual face configuration with said first metal electrode layer and so that at least a first portion of said second, said third, and a seventh active regions are passed on, a third metal electrode layer for being formed so that any portion of said third active region is passed on, a fourth metal electrode layer for being formed so that any portion of said third active region is passed on, a fifth metal electrode layer for being formed so that any portion of a tenth active region is passed on, and a sixth metal electrode layer for being formed so that it has a symmetrically mutual face configuration with said fifth metal electrode layer.

13. A multi-port static random access memory according to claim 12, wherein a contact region of said power supply voltage is respectively formed on said first, second, and fourth active regions and on first electrodes of said first and second metal electrode layers, and first to third contact regions for said first common node are respectively formed on said third active region of a first electrode of said third metal electrode layer, on an upper portion of said second metal electrode layer, and on said first active region of a second electrode of said first metal electrode layer.

14. A multi-port static random access memory according to claim 12, wherein first to third contact regions for said second common node are respectively formed on said third active region of a first electrode of said fourth metal electrode layer, an upper portion of said first metal electrode layer, and said second active region of a second electrode of said second metal electrode layer.

15. A multi-port static random access memory according to claim 12, wherein contact regions of the pair of said write bit lines are respectively formed on said third active region of second electrodes of said third and fourth metal electrode layers.

16. A multi-port static random access memory according to claim 12, wherein contact regions of the first pair of said write word lines are respectively positioned at an edge of the cell formation region and are respectively formed on an end portion of said third and fourth metal electrode layers, and contact regions of a power supply ground are formed on a fifth active region.

17. A multi-port static random access memory according to claim 12, wherein contact regions of the first pair of said read word lines are respectively positioned at an edge of the cell formation region and are respectively formed on an end portion of said fifth and sixth metal electrode layers, and contact regions of the first pair of said read bit lines are respectively formed on twelfth and thirteenth active regions of first electrodes of said fifth and sixth metal electrode layers.

18. A multi-port static random access memory according to claim 10 wherein said unit cells further includes a plurality of metal electrical wire groups having:

a first metal electrical wire group consisting of a first metal electrical wire layer for being electrically contacted with contact regions of said power supply voltage and with the first electrodes of the first pair of said first and second load transistors, second and third metal electrical wire layers for being respectively coupled to a corresponding contact region of write word lines, a fourth metal electrical wire layer for being electrically connected to first to third contact regions for said first common node, sixth and seventh metal electrical wire layers for being electrically connected to contact regions of the pair of write bit lines, eighth and ninth metal electrical wire layers for being electrically connected to a corresponding contact region of read word lines, a tenth metal electrical wire layer for being electrical connected to contact regions of a power supply ground and for being extended to an upper side of a third active region, and eleventh and twelfth metal electrical wire layers for being electrically connected to contact regions of the pair of said read bit lines.

19. A multi-port static random access memory according to claim 18 wherein the plurality of metal electrical wire groups further have a second metal electrical wire group consisting of a first metal electrical wire layer for being electrically contacted with said first metal electrical wire layer of said first metal electrical wire group and for being utilized as said power supply voltage, a second metal electrical wire layer for being electrically contacted with said second and third metal electrical wire layers of said first metal electrical wire group, third to fifth metal electrical wire layers for being electrically contacted with said sixth, seventh, and tenth metal electrical wire layers of said first metal electrical wire group, a sixth metal electrical wire layer for being electrically contacted with said eighth and ninth metal electrical wire layers of said first metal electrical wire group and for functioning as the corresponding first of said read word lines, and seventh and eighth metal electrical wire layers for being separated from each of the other electrical wire layers in the second metal electrical wire group and for being electrically contacted with said eleventh and twelfth metal electrical wire layers of said first metal electrical wire group.

20. A multi-port static random access memory according to claim 19 wherein the plurality of metal electrical wire groups further have a third metal electrical wire group consisting of first and second metal electrical wire layers for being utilized as the pair of said write bit lines and for being electrically contacted with said third and fourth metal electrical wire layers of said second metal electrical wire group via a second plurality of via holes, third and fourth metal electrical wire layers for being utilized as the pair of said read bit lines and for being electrically contacted with said seventh and eighth metal electrical wire layers of said second metal electrical wire group, a fifth metal electrical wire layer for functioning as said power supply ground and for being electrically contacted with said fifth metal electrical wire layer of said second metal electrical wire group.

21. A multi-port static random access memory according to claim 11 wherein long axes of said first and second active regions each is in a horizontal direction.

22. A multi-port static random access memory according to claim 12 wherein said first metal electrode layer includes a first part to pass on a center of said first active region in a horizontal direction, a second part to be extended to said first part in the horizontal direction, and a third part to be passed on perpendicularly to said second part in a vertical direction and to successively cross-pass said third and sixth active regions.

23. A multi-port random access memory according to claim 12 wherein said second metal electrode layer has a symmetrical face configuration at which a center of said first active region is passed on in a vertical direction and said third and sixth active regions are successively cross-passed.

24. A multi-port static random access memory according to claim 18 wherein electrodes of said first metal electrical wire layer of said first metal electrical wire group is not positioned at a same horizontal direction as said fourth active region, thereby having a vertical part perpendicular to an edge of the cell formation region.

25. A multi-port static random access memory according to claim 2 wherein a number of contact regions on the second plurality of said active regions are smaller than those of contact regions on the first plurality of said active regions, in a horizontal direction.

26. A multi-port static random access memory according to claim 3 wherein a number of contact regions on the second plurality of said active regions are smaller than those of contact regions on the first plurality of said active regions, in a horizontal direction.

27. A multi-port static random access memory according to claim 4 wherein a number of contact regions on the second plurality of said active regions are smaller than those of contact regions on the first plurality of said active regions, in a horizontal direction.

28. A multi-port static random access memory according to claim 5 wherein a number of contact regions on the second plurality of said active regions are smaller than those of contact regions on the first plurality of said active regions, in a horizontal direction.

29. A multi-port static random access memory according to claim 6 wherein a number of contact regions on the second plurality of said active regions are smaller than those of contact regions on the first plurality of said active regions, in a horizontal direction.

30. A multi-port static random access memory according to claim 11, wherein a contact region of said power supply voltage is respectively formed on said first, second, and fourth active regions and on first electrodes of said first and second metal electrode layers, and first to third contact regions for said first common node are respectively formed on said third active region of a first electrode of a third metal electrode layer, on an upper portion of said second metal electrode layer, and on said first active region of a second electrode of said first metal electrode layer.

31. A multi-port static random access memory according to claim 12, wherein a contact region of said power supply voltage is respectively formed on said first, second, and fourth active regions and on first electrodes of said first and second metal electrode layers, and first to third contact regions for said first common node are respectively formed on said third active region of a first electrode of said third metal electrode layer, on an upper portion of said second metal electrode layer, and on said first active region of second electrode of first metal electrode layer.

32. A multi-port static random access memory according to claim 11, wherein first to third contact regions for said second common node are respectively formed on a third active region of a first electrode of a fourth metal electrode layer, an upper portion of said first metal electrode layer, and said second active region of a second electrode of said second metal electrode layer.

33. A multi-port static random access memory according to claim 12, wherein first to third contact regions for said second common node are respectively formed on said third active region of a first electrode of said fourth metal electrode layer, upper portion of said first metal electrode layer, and said second active region of a second electrode of said second metal electrode layer.

34. A multi-port static random access memory according to claim 11, wherein contact regions of the pair of said write bit lines are respectively formed on a third active region of second electrodes of third and fourth metal electrode layers.

35. A multi-port static random access memory according to claim 12, wherein contact regions of the pair of said write bit lines are respectively formed on said third active region of second electrodes of third and fourth metal electrode layers.

36. A multi-port static random access memory according to claim 11, wherein contact regions of write word lines are respectively positioned at an edge of the cell formation region and are respectively formed on an end portion of third and fourth metal electrode layers, and contact regions of a power supply ground are formed on a fifth active region.

37. A multi-port static random access memory according to claim 12, wherein contact regions of write word lines are respectively positioned at an edge of the cell formation region and are respectively formed on an end portion of said third and fourth metal electrode layers, and contact regions of a power supply ground are formed on a fifth active region.

38. A multi-port static random access memory according to claim 11, wherein contact regions of the pair of said read word lines are respectively positioned at an edge of the cell formation region are respectively formed on an end portion of fifth and sixth metal electrode layers, and contact regions of the pair of said read bit lines are respectively formed on twelfth and thirteenth active regions of first electrodes of said fifth and sixth metal electrode layers.

39. A multi-port static random access memory according to claim 12, wherein contact regions of the pair of said read word lines are respectively positioned at edge of the cell formation region and are respectively formed on an end portion of said fifth and sixth metal electrode layers, and contact regions of the pair of said read bit lines are respectively formed on twelfth and thirteen active regions of first electrodes of said fifth and sixth metal electrode layers.

* * * * *